(12) United States Patent
Lai et al.

(10) Patent No.: US 12,113,033 B2
(45) Date of Patent: Oct. 8, 2024

(54) CHIP PACKAGE STRUCTURE

(71) Applicant: Taiwan Semiconductor Manufacturing Company, Ltd., Hsinchu (TW)

(72) Inventors: Po-Chen Lai, Hsinchu County (TW); Chin-Hua Wang, New Taipei (TW); Ming-Chih Yew, Hsinchu (TW); Chia-Kuei Hsu, Hsinchu (TW); Li-Ling Liao, Hsinchu (TW); Po-Yao Lin, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/344,039

(22) Filed: Jun. 29, 2023

(65) Prior Publication Data

US 2023/0343725 A1    Oct. 26, 2023

Related U.S. Application Data

(63) Continuation of application No. 17/377,583, filed on Jul. 16, 2021, now Pat. No. 11,728,284.

(51) Int. Cl.
*H01L 23/538*    (2006.01)
*H01L 21/48*    (2006.01)
(Continued)

(52) U.S. Cl.
CPC ........ *H01L 23/562* (2013.01); *H01L 21/4853* (2013.01); *H01L 23/5383* (2013.01);
(Continued)

(58) Field of Classification Search
CPC ... H01L 23/562; H01L 24/16; H01L 21/4853; H01L 23/5383; H01L 23/5386
See application file for complete search history.

(56) References Cited

U.S. PATENT DOCUMENTS 9,331,024 B2    5/2016    Chen et al.
10,290,586 B2    5/2019    Hu
(Continued)

FOREIGN PATENT DOCUMENTS

CN    101604674 B    12/2010
CN    102693962 A    9/2012
(Continued)

OTHER PUBLICATIONS

Chinese language office action dated Jan. 4, 2022, issued in application No. TW 110133206.

*Primary Examiner* — Evan G Clinton
(74) *Attorney, Agent, or Firm* — McClure, Qualey & Rodack, LLP

(57) ABSTRACT

A chip package structure is provided. The chip package structure includes a redistribution structure including a dielectric structure and a plurality of wiring layers in or over the dielectric structure. The chip package structure includes a shield bump structure over the redistribution structure and electrically insulated from the wiring layers. The chip package structure includes a first chip structure bonded to the redistribution structure. The first chip structure is electrically insulated from the shield bump structure, and the first chip structure partially overlaps the shield bump structure. The chip package structure includes a second chip structure bonded to the redistribution structure.

20 Claims, 33 Drawing Sheets

(51) Int. Cl.
*H01L 23/00* (2006.01)
*H01L 25/00* (2006.01)
*H01L 25/065* (2023.01)

(52) U.S. Cl.
CPC ...... *H01L 23/5386* (2013.01); *H01L 25/0655* (2013.01); *H01L 25/50* (2013.01); *H01L 24/16* (2013.01); *H01L 24/73* (2013.01); *H01L 2224/16238* (2013.01); *H01L 2224/73204* (2013.01)

(56) References Cited

U.S. PATENT DOCUMENTS

| | | |
|---|---|---|
| 2003/0219966 A1 | 11/2003 | Jin et al. |
| 2005/0133854 A1 | 6/2005 | Park |
| 2019/0348386 A1* | 11/2019 | Huang .................. H01L 21/565 |
| 2020/0098707 A1 | 3/2020 | Chen et al. |
| 2021/0118812 A1* | 4/2021 | Liu .................... H01L 21/4871 |
| 2021/0287999 A1* | 9/2021 | Min .................... H01L 23/3185 |
| 2022/0352138 A1 | 11/2022 | Choi |

FOREIGN PATENT DOCUMENTS

| | | |
|---|---|---|
| CN | 103794570 A | 5/2014 |
| CN | 107424974 A | 12/2017 |

* cited by examiner

CHIP PACKAGE STRUCTURE

CROSS REFERENCE

This application is a Continuation of U.S. application Ser. No. 17/377,583, filed on Jul. 16, 2021, now U.S. Pat. No. 11,728,284, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits (IC) are typically manufactured on a semiconductor wafer. Technological advances in IC materials and design have produced generations of ICs. Each generation has smaller and more complex circuits than the previous generation. The dies of the wafer may be processed and packaged at the wafer level, and various technologies have been developed for wafer level packaging. Since the chip package structure may need to include multiple chips with multiple functions, it is a challenge to form a reliable chip package structure with multiple chips.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1I are cross-sectional views of various stages of a process for forming a chip package structure, in accordance with some embodiments.

FIG. 1B-1 is a top view of the shield pad of FIG. 1B, in accordance with some embodiments.

FIG. 1E-1 is a top view of the chip package structure of FIG. 1E, in accordance with some embodiments.

FIG. 1F-1 is a top view of the chip package structure of FIG. 1F, in accordance with some embodiments.

FIG. 1F-2 is a cross-sectional view of the chip structure of FIG. 1F, in accordance with some embodiments.

FIG. 1I-1 is a top view of the chip package structure of FIG. 1I, in accordance with some embodiments.

FIG. 2 is a top view of a chip package structure, in accordance with some embodiments.

FIG. 3 is a top view of a chip package structure, in accordance with some embodiments.

FIG. 4 is a top view of a chip package structure, in accordance with some embodiments.

FIG. 5 is a top view of a chip package structure, in accordance with some embodiments.

FIG. 6 is a top view of a chip package structure, in accordance with some embodiments.

FIG. 7 is a top view of a chip package structure, in accordance with some embodiments.

FIG. 8 is a top view of a chip package structure, in accordance with some embodiments.

FIG. 9 is a top view of a chip package structure, in accordance with some embodiments.

FIG. 10 is a top view of a chip package structure, in accordance with some embodiments.

FIG. 11 is a top view of a chip package structure, in accordance with some embodiments.

FIG. 12 is a top view of a chip package structure, in accordance with some embodiments.

FIG. 13 is a top view of a chip package structure, in accordance with some embodiments.

FIG. 14 is a top view of a chip package structure, in accordance with some embodiments.

FIGS. 15A-15C are cross-sectional views of various stages of a process for forming a chip package structure, in accordance with some embodiments.

FIGS. 16A-16C are cross-sectional views of various stages of a process for forming a chip package structure, in accordance with some embodiments.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term “substantially” in the description, such as in “substantially flat” or in “substantially coplanar”, etc., will be understood by the person skilled in the art. In some embodiments the adjective substantially may be removed. Where applicable, the term “substantially” may also include embodiments with “entirely”, “completely”, “all”, etc. The term “substantially” may be varied in different technologies and be in the deviation range understood by the skilled in the art. For example, the term “substantially” may also relate to 90% of what is specified or higher, such as 95% of what is specified or higher, especially 99% of what is specified or higher, including 100% of what is specified, though the present invention is not limited thereto. Furthermore, terms such as “substantially parallel” or “substantially perpendicular” may be interpreted as not to exclude insignificant deviation from the specified arrangement and may include for example deviations of up to 10°. The word “substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1A:
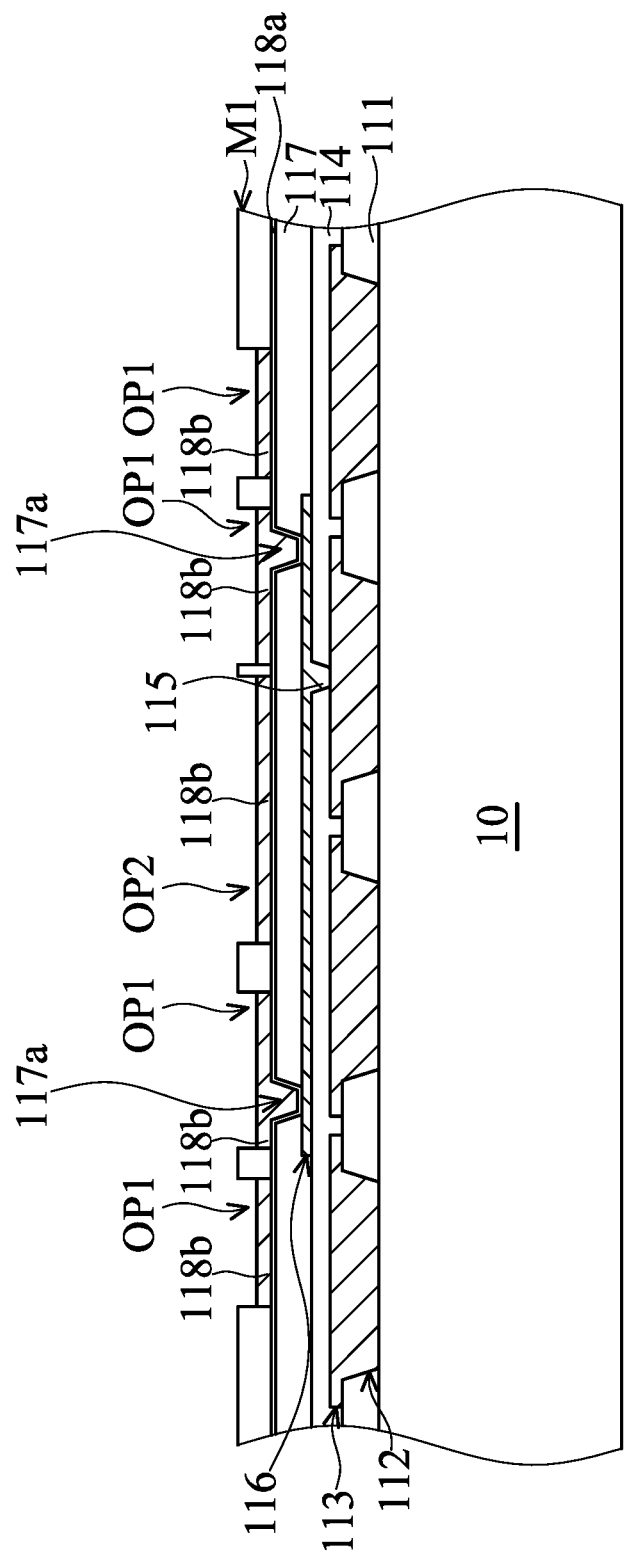

As shown in FIG. 1A, a carrier substrate 10 is provided, in accordance with some embodiments. The carrier substrate 10 is made of glass, silicon, metal or another suitable material, in accordance with some embodiments. As shown in FIG. 1A, a dielectric layer 111 is formed over the carrier substrate 10, in accordance with some embodiments.

The dielectric layer 111 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 111 is formed using a deposition process (e.g. a chemical vapor deposition process or a physical vapor deposition process), a photolithography process, and an etching process, in accordance with some embodiments.

As shown in FIG. 1A, bonding pads 112 and a wiring layer 113 are respectively formed in and over the dielectric layer 111, in accordance with some embodiments. The bonding pads 112 and the wiring layer 113 are made of a conductive material, such as metal (e.g. copper, aluminum, or tungsten) or alloys thereof, in accordance with some embodiments.

As shown in FIG. 1A, a dielectric layer 114 is formed over the wiring layer 113 and the dielectric layer 111, in accordance with some embodiments. The dielectric layer 114 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 114 is formed using a deposition process (e.g. a chemical vapor deposition process or a physical vapor deposition process), a photolithography process, and an etching process, in accordance with some embodiments.

As shown in FIG. 1A, conductive vias 115 and a wiring layer 116 are respectively formed in and over the dielectric layer 114, in accordance with some embodiments. The conductive vias 115 and the wiring layer 116 are made of a conductive material, such as metal (e.g. copper, aluminum, or tungsten) or alloys thereof, in accordance with some embodiments.

As shown in FIG. 1A, a dielectric layer 117 is formed over the wiring layer 116 and the dielectric layer 114, in accordance with some embodiments. The dielectric layer 117 has openings 117a, in accordance with some embodiments. The openings 117a expose the wiring layer 116 thereunder, in accordance with some embodiments.

The dielectric layer 117 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 117 is formed using a deposition process (e.g. a chemical vapor deposition process or a physical vapor deposition process), a photolithography process, and an etching process, in accordance with some embodiments.

As shown in FIG. 1A, a seed layer 118a is conformally formed over the dielectric layer 117 and the exposed wiring layer 116, in accordance with some embodiments. The seed layer 118a is made of a conductive material, such as metal (e.g., copper, aluminum, gold, silver, or tungsten) or alloys thereof, in accordance with some embodiments. The seed layer 118a is formed using a deposition process, such as a physical vapor deposition process or a chemical vapor deposition process, in accordance with some embodiments.

As shown in FIG. 1A, a mask layer M1 is formed over the seed layer 118a, in accordance with some embodiments. The mask layer M1 has openings OP1 and OP2 exposing the seed layer 118a thereunder, in accordance with some embodiments. The mask layer M1 is made of a polymer material, such as a photoresist material, in accordance with some embodiments.

As shown in FIG. 1A, a conductive layer 118b is formed in the openings OP1 and OP2 and over the seed layer 118a, in accordance with some embodiments. The conductive layer 118b is made of a conductive material, such as metal (e.g., copper, aluminum, gold, silver, or tungsten) or alloys thereof, in accordance with some embodiments. The conductive layer 118b is formed using a plating process, such as an electroplating process, in accordance with some embodiments.

Figure 1B:
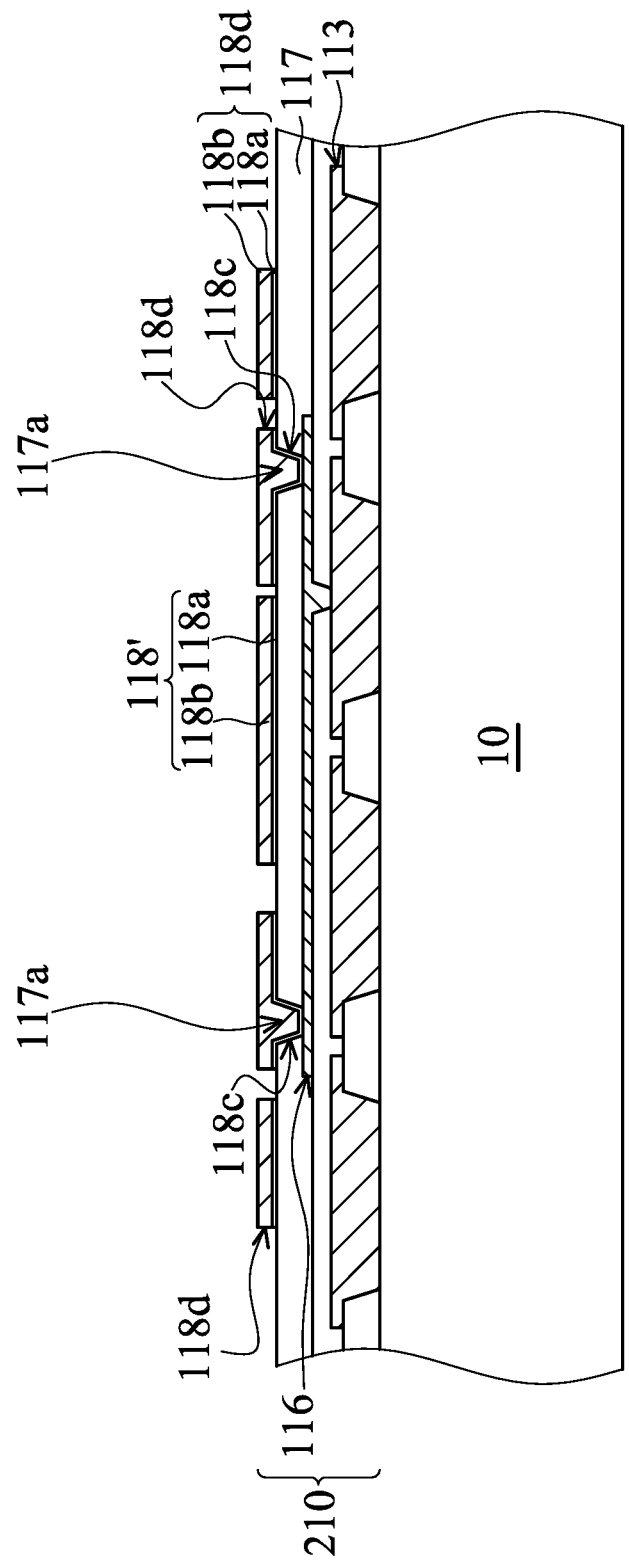

As shown in FIG. 1B, the mask layer M1 and the seed layer 118a under the mask layer M1 are removed, in accordance with some embodiments. The conductive layer 118b in the openings 117a and the seed layer 118a thereunder together form conductive vias 118c, in accordance with some embodiments.

The conductive layer 118b over the dielectric layer 117 and originally in the openings OP1 and the seed layer 118a thereunder together form a wiring layer 118d, in accordance with some embodiments. The wiring layer 118d is a topmost one of the wiring layers 113, 116 and 118d, in accordance with some embodiments.

The conductive layer 118b over the dielectric layer 117 and originally in the openings OP2 and the seed layer 118a thereunder together form a shield pad 118', in accordance with some embodiments. The shield pad 118' and the wiring layer 118d are made of a same material, in accordance with some embodiments. The shield pad 118' is electrically insulated from the wiring layers 113, 116 and 118d, in accordance with some embodiments.

Figures 1, 1B:
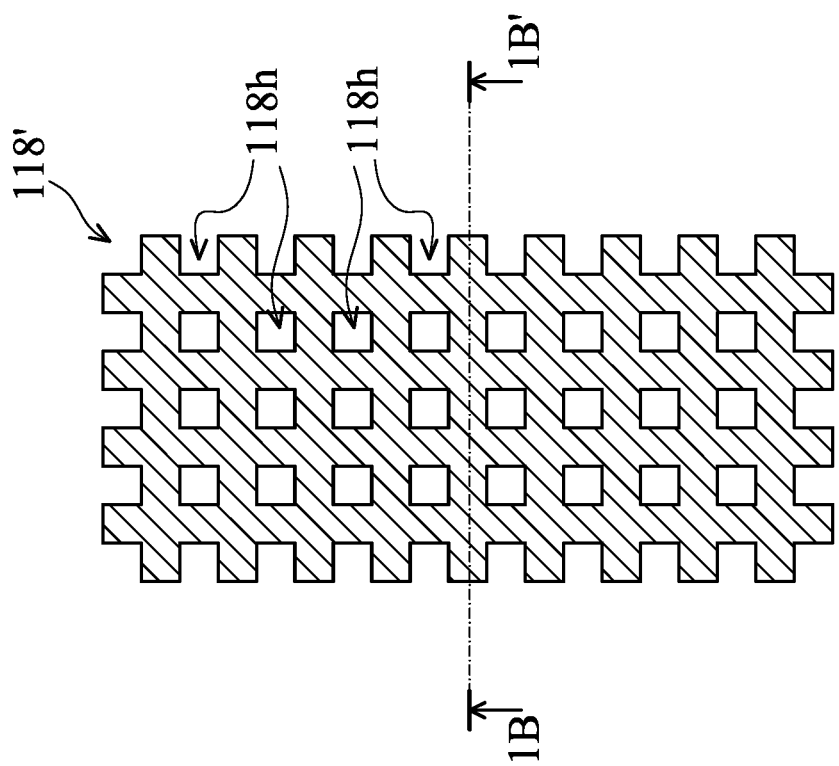

FIG. 1B-1 is a top view of the shield pad of FIG. 1B, in accordance with some embodiments. FIG. 1B shows a cross-sectional view of the shield pad 118' along a sectional line 1B-1B' in FIG. 1B-1, in accordance with some embodiments. As shown in FIGS. 1B and 1B-1, the shield pad 118' has a mesh shape, in accordance with some embodiments. The shield pad 118' has holes 118h, in accordance with some embodiments. The holes 118h are through holes, in accordance with some embodiments. In some embodiments, the holes 118*h* are arranged in an array. In some other embodiments, the holes 118*h* are arranged randomly.

As shown in FIGS. 1B and 1B-1, a ratio of a top surface area of the conductive layer 118*b* to the total area of the shield pad 118', including the top surface area of the conductive layer 118*b* and the total area of the holes 118*h*, is greater than about 0.5, in accordance with some embodiments. If the ratio is less than about 0.5, the stress shielding ability of the shield pad 118' is not enough to protect the wires thereunder, in accordance with some embodiments. In some embodiments, the ratio ranges from about 0.7 to about 1.

The holes 118*h* are also referred to as outgassing holes, in accordance with some embodiments. The holes 118*h* are able to permit outgassing of the dielectric layer 117, which prevents the shield pad 118' from being damaged by outgassing phenomena, in accordance with some embodiments. Therefore, the holes 118*h* improve the reliability of the shield pad 118', in accordance with some embodiments. In this step, a redistribution structure 210 is substantially formed, in accordance with some embodiments.

Figure 1C:
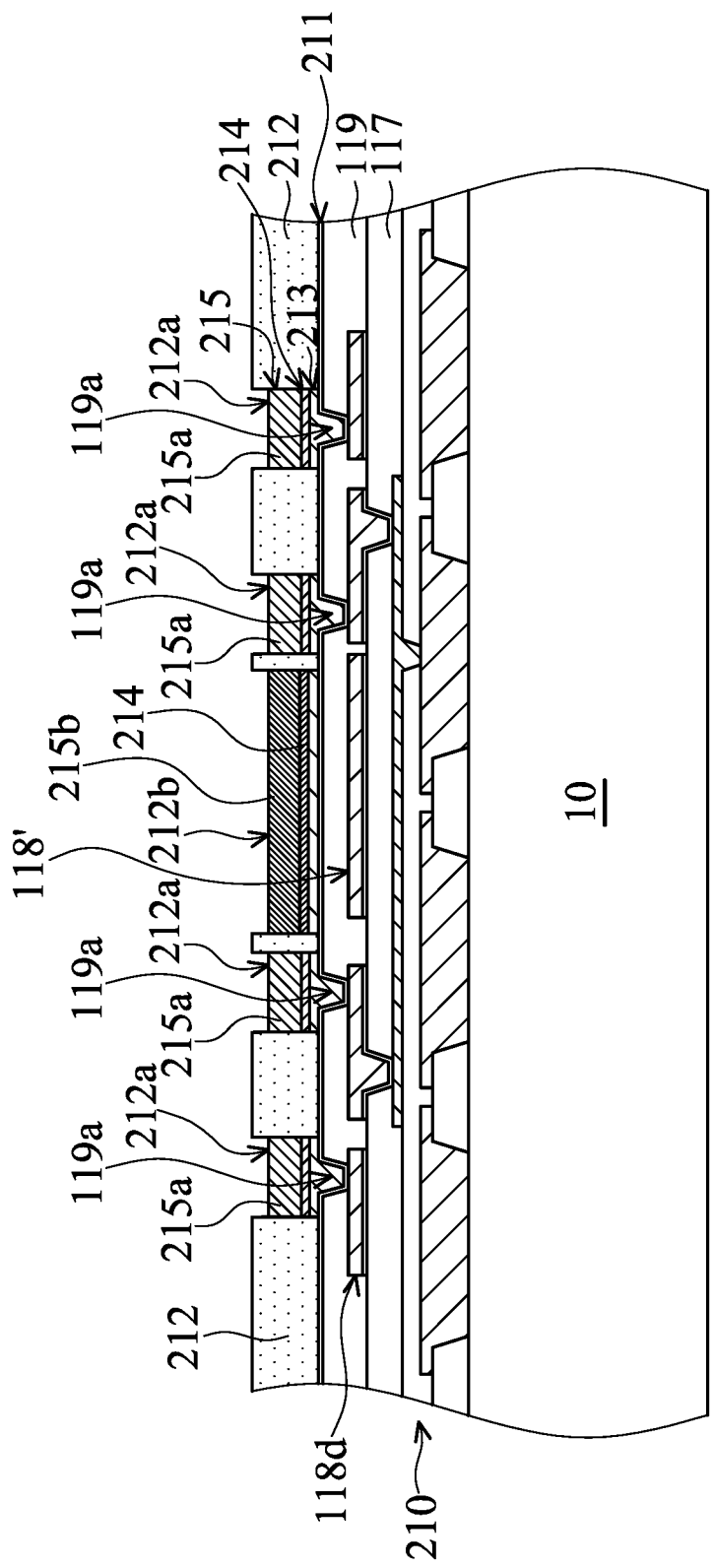

As shown in FIG. 1C, a dielectric layer 119 is formed over the dielectric layer 117, the wiring layer 118*d*, and the shield pad 118', in accordance with some embodiments. The dielectric layer 119 is used to be a stress buffer layer, in accordance with some embodiments. The dielectric layer 119 has openings 119*a*, in accordance with some embodiments. The openings 119*a* expose the wiring layer 118*d* thereunder, in accordance with some embodiments.

The dielectric layer 119 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 119 is formed using a deposition process (e.g. a chemical vapor deposition process or a physical vapor deposition process), a photolithography process, and an etching process, in accordance with some embodiments.

As shown in FIG. 1C, a seed layer 211 is conformally formed over the dielectric layer 119 and the exposed wiring layer 118*d*, in accordance with some embodiments. The seed layer 211 is made of a conductive material, such as metal (e.g., copper, aluminum, gold, silver, or tungsten) or alloys thereof, in accordance with some embodiments. The seed layer 211 is formed using a deposition process, such as a physical vapor deposition process or a chemical vapor deposition process, in accordance with some embodiments.

As shown in FIG. 1C, a mask layer 212 is formed over the seed layer 211, in accordance with some embodiments. The mask layer 212 has openings 212*a* and 212*b* exposing the seed layer 211 thereunder, in accordance with some embodiments. The mask layer 212 is made of a polymer material, such as a photoresist material, in accordance with some embodiments.

As shown in FIG. 1C, an under bump metallization layer 213 is formed in the openings 212*a* and 212*b* and over the seed layer 211, in accordance with some embodiments. The under bump metallization layer 213 is made of a conductive material, such as metal (e.g., titanium, copper, and/or nickel) or alloys thereof (e.g. titanium copper), in accordance with some embodiments. The under bump metallization layer 213 is formed using a plating process, such as an electroplating process, in accordance with some embodiments.

As shown in FIG. 1C, a barrier layer 214 is formed in the openings 212*a* and 212*b* and over the under bump metallization layer 213, in accordance with some embodiments. The barrier layer 214 is used to prevent the material of bumps subsequently formed over the barrier layer 214 from diffusing into the under bump metallization layer 213, in accordance with some embodiments. The barrier layer 214 is made of a conductive material, such as metal (e.g., tantalum) or nitrides (e.g. titanium nitride and/or tantalum nitride), in accordance with some embodiments. The barrier layer 214 is formed using a plating process, such as an electroplating process, in accordance with some embodiments.

As shown in FIG. 1C, a conductive layer 215 is formed in the openings 212*a* and 212*b* and over the barrier layer 214, in accordance with some embodiments. The conductive layer 215 in the openings 212*a* form conductive bumps 215*a*, in accordance with some embodiments. The conductive layer 215 in the openings 212*b* form a shield bump 215*b*, in accordance with some embodiments.

The conductive layer 215 is made of a conductive material, such as metal (e.g., titanium, copper, nickel, or aluminum) or alloys thereof, in accordance with some embodiments. The conductive layer 215 is formed using a plating process, such as an electroplating process, in accordance with some embodiments.

Figure 1D:
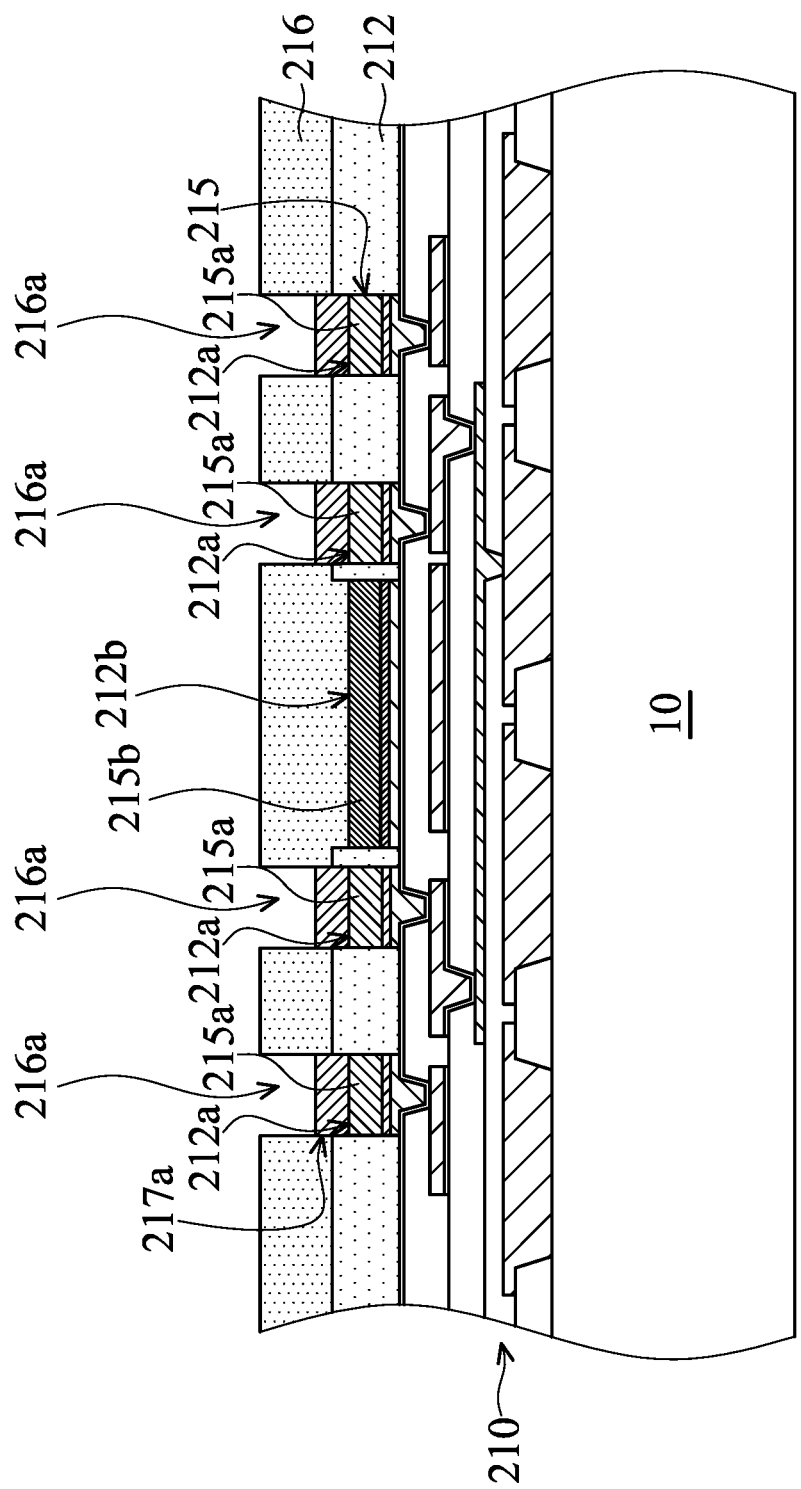

As shown in FIG. 1D, a mask layer 216 is formed over the mask layer 212 and the shield bump 215*b*, in accordance with some embodiments. The mask layer 216 has openings 216*a* over the openings 212*a* and exposing the conductive bumps 215*a*, in accordance with some embodiments. The mask layer 216 is made of a polymer material, such as a photoresist material, in accordance with some embodiments.

As shown in FIG. 1D, a solder layer 217*a* is formed in the openings 216*a* and over the conductive bumps 215*a*, in accordance with some embodiments. The solder layer 217*a* is made of a conductive material, such as a tin-based alloy, in accordance with some embodiments. The solder layer 217*a* is formed using a plating process, such as an electroplating process, in accordance with some embodiments.

Figure 1E:
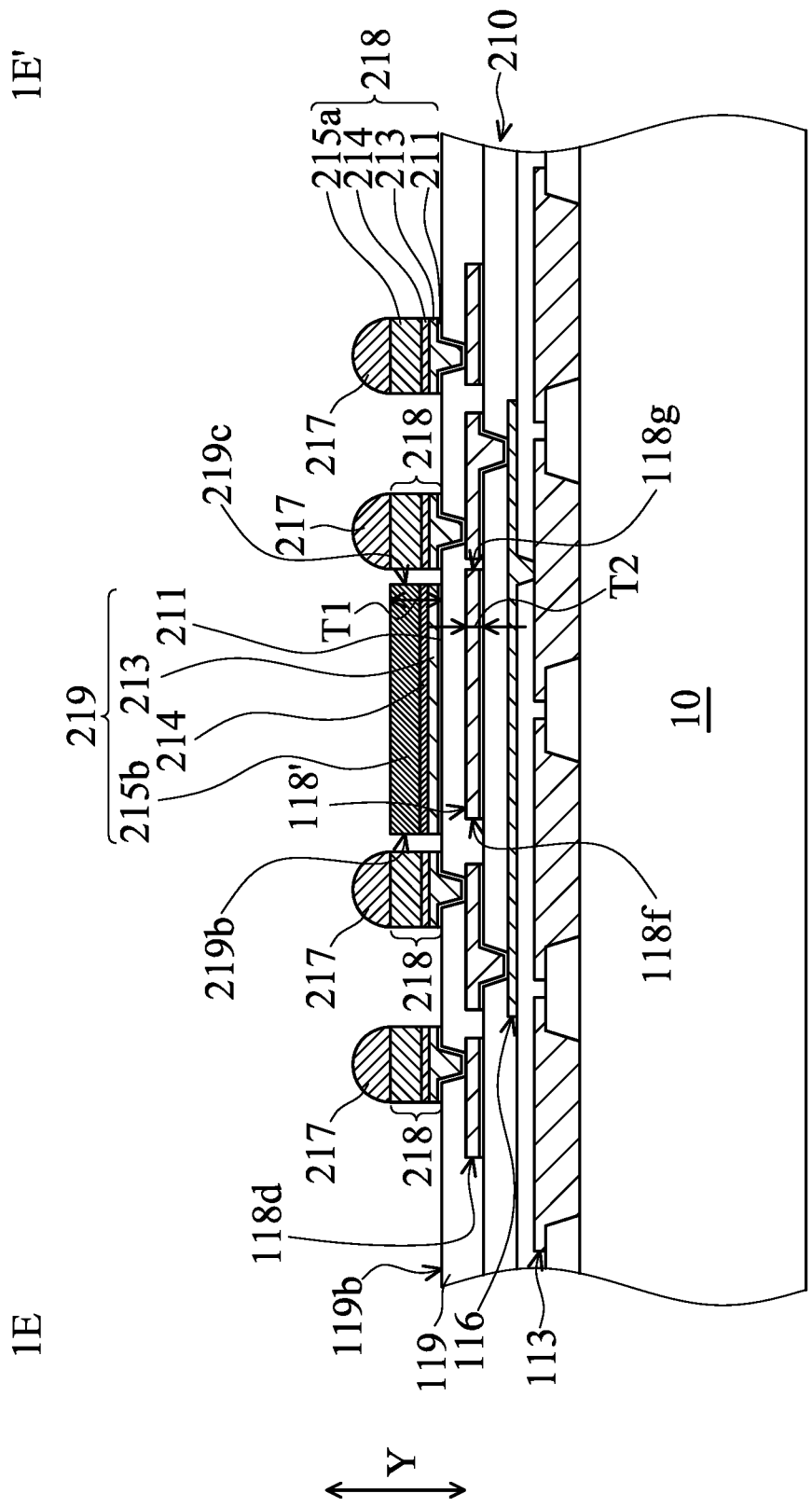
Figures 1, 1E:
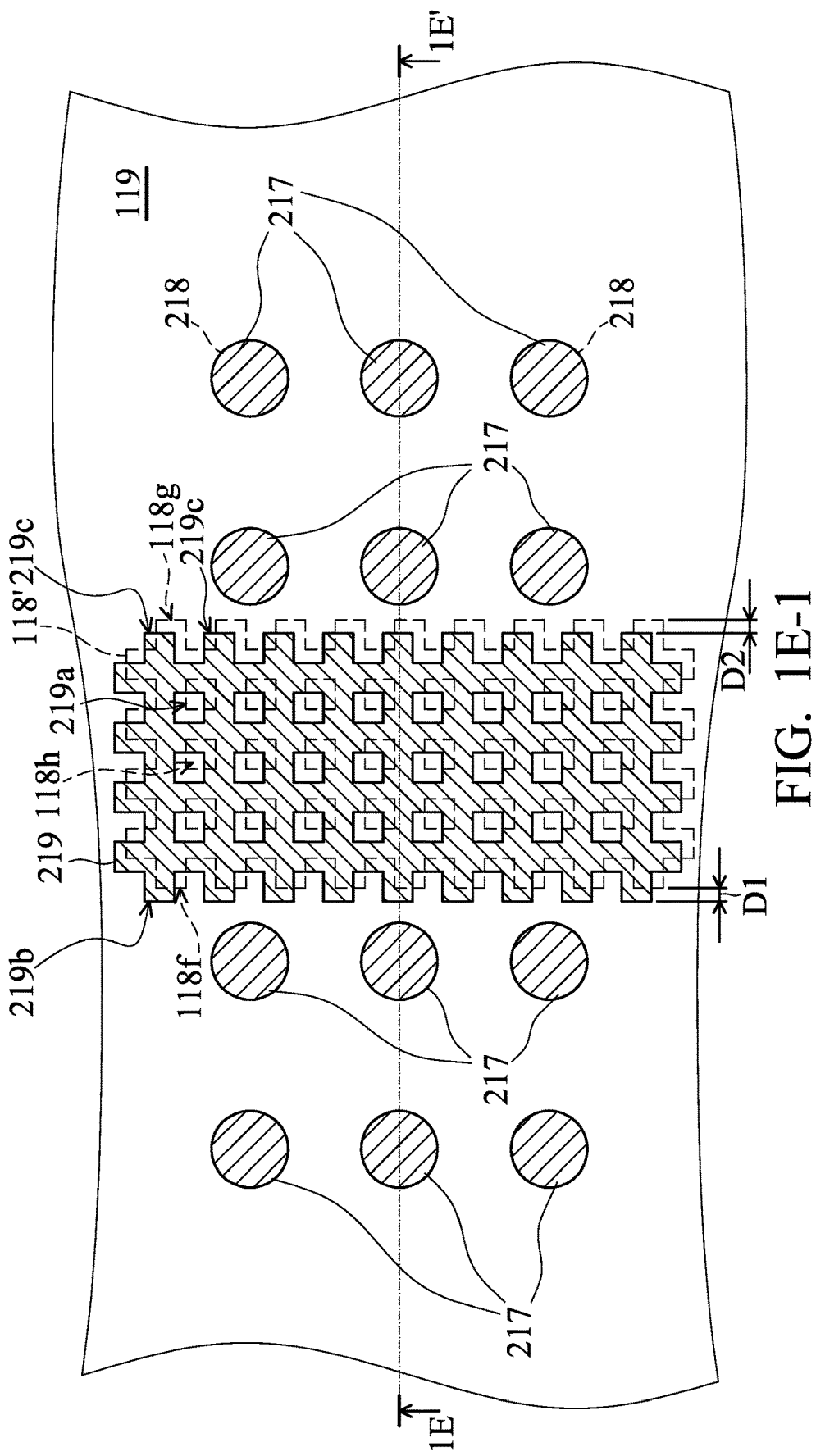

As shown in FIG. 1E, the mask layers 212 and 216 and the seed layer 211 under the mask layer 212 are removed, in accordance with some embodiments. Each conductive bump 215*a*, the barrier layer 214 thereunder, the under bump metallization layer 213 thereunder, and the seed layer 211 thereunder together form a conductive bump structure 218, in accordance with some embodiments. The conductive bump structures 218 are electrically connected to the wiring layers 113, 116, and 118*d*, in accordance with some embodiments. As shown in FIG. 1E, the solder layer 217*a* is reflowed to form solder bumps 217 over the conductive bump structures 218, in accordance with some embodiments.

The shield bump 215*b*, the barrier layer 214 thereunder, the under bump metallization layer 213 thereunder, and the seed layer 211 thereunder together form a shield bump structure 219, in accordance with some embodiments. The shield bump structure 219 is electrically insulated from the wiring layers 113, 116, and 118*d*, in accordance with some embodiments.

The shield bump structure 219 is thicker than the shield pad 118', in accordance with some embodiments. That is, the thickness T1 of the shield bump structure 219 is greater than the thickness T2 of the shield pad 118', in accordance with some embodiments. The shield bump structure 219 is thicker than each wiring layer 113, 116, or 118*d*, in accordance with some embodiments.

FIG. 1E-1 is a top view of the chip package structure of FIG. 1E, in accordance with some embodiments. FIG. 1E is a cross-sectional view illustrating the chip package structure along a sectional line 1E-1E' in FIG. 1E-1, in accordance with some embodiments. As shown in FIGS. 1E and 1E-1, the shield bump structure 219 partially overlaps the shield pad 118', in accordance with some embodiments. As shown in FIGS. 1E and 1E-1, the shield bump structure 219 has holes 219a exposing the dielectric layer 119 thereunder, in accordance with some embodiments. The shield bump structure 219 has opposite sidewalls 219b and 219c, in accordance with some embodiments.

The shield pad 118' has opposite sidewalls 118f and 118g, in accordance with some embodiments. The sidewall 219b is misaligned with the sidewall 118f in an axis Y perpendicular to a top surface 119b of the dielectric layer 119, in accordance with some embodiments. The sidewall 219c is misaligned with the sidewall 118g in the axis Y, in accordance with some embodiments.

As shown in FIG. 1E-1, the sidewall 219b is spaced apart from the sidewall 118f by as distance D1, in accordance with some embodiments. The sidewall 219c is spaced apart from the sidewall 118g by as distance D2, in accordance with some embodiments. The distance D1 or D2 ranges from about 5 μm to about 50 μm, in accordance with some embodiments. As shown in FIG. 1E-1, the holes 219a of the shield bump structure 219 are misaligned with the holes 118h of the shield pad 118', in accordance with some embodiments.

Since the misalignment design may increase the stress transmitting path length from an edge of a chip structure subsequently formed to the wiring layers under the shield pad 118', the misalignment design may improve the stress shielding ability of the shield bump structure 219 and the shield pad 118'. Therefore, the reliability of the chip package structure with the shield bump structure 219 and the shield pad 118' is improved, in accordance with some embodiments.

Figure 1F:
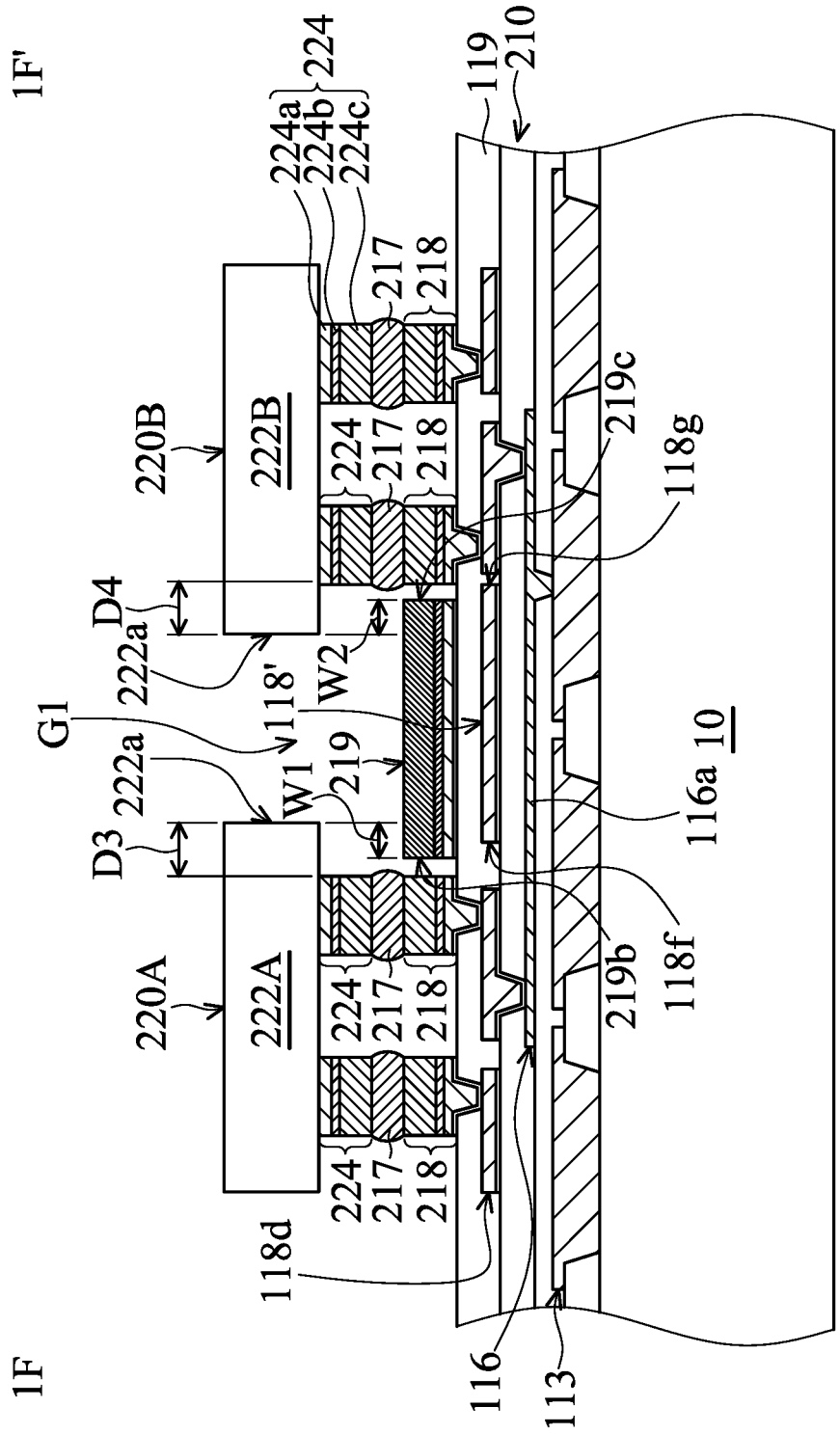
Figures 1, 1F:
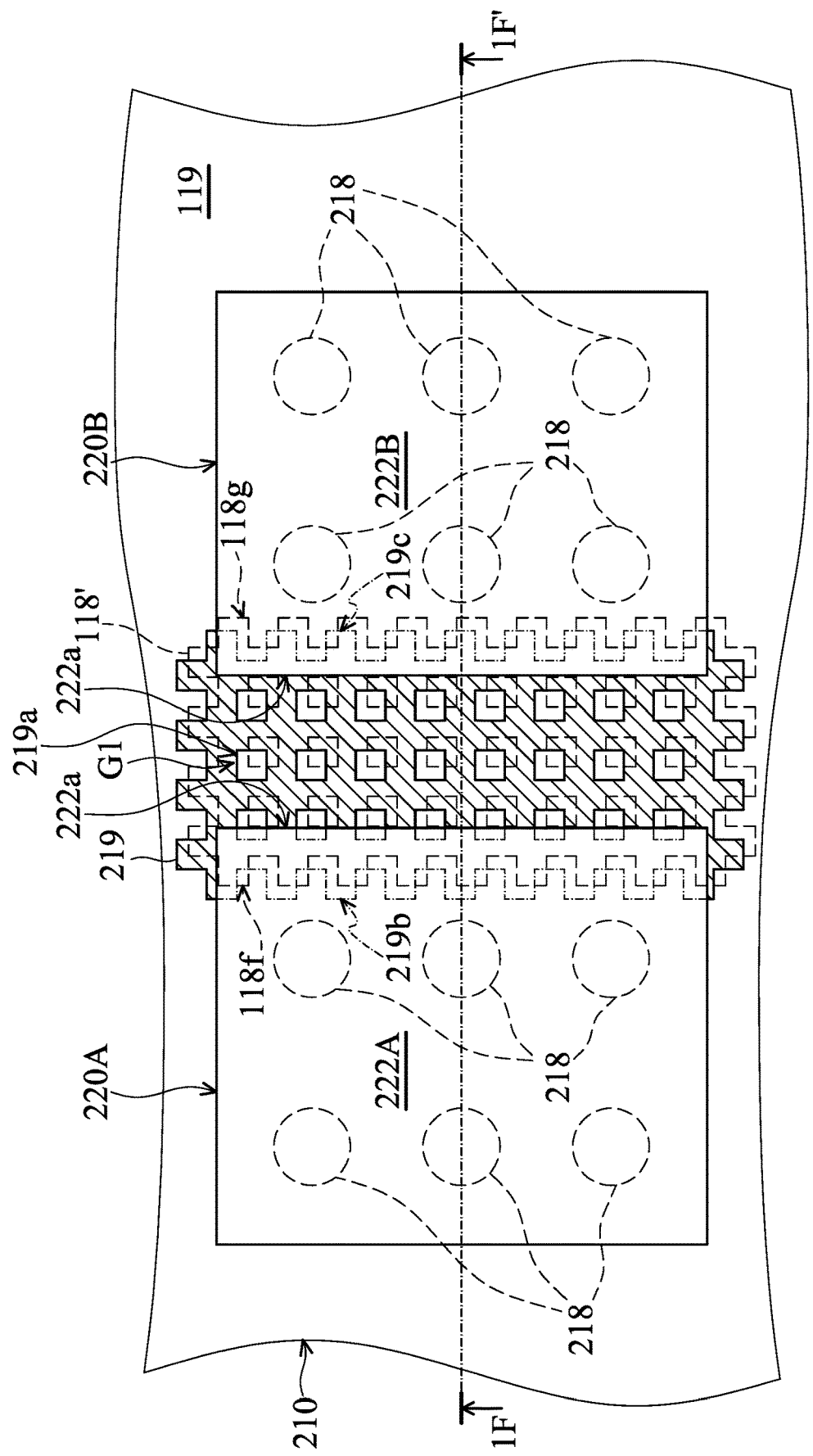

FIG. 1F-1 is a top view of the chip package structure of FIG. 1F, in accordance with some embodiments. FIG. 1F is a cross-sectional view illustrating the chip package structure along a sectional line 1F-1F' in FIG. 1F-1, in accordance with some embodiments. As shown in FIGS. 1F and 1F-1, chip structures 220A and 220B are bonded to the solder bumps 217, in accordance with some embodiments. The chip structures 220A and 220B are electrically connected to the wiring layer 118d through the solder bumps 217 and the conductive bump structures 218, in accordance with some embodiments.

The chip structures 220A and 220B are electrically insulated from the shield bump structure 219 and the shield pad 118', in accordance with some embodiments. The chip structure 220A extends across the sidewall 219b of the shield bump structure 219 and the sidewall 118f of the shield pad 118', in accordance with some embodiments. The chip structure 220B extends across the sidewall 219c of the shield bump structure 219 and the sidewall 118g of the shield pad 118', in accordance with some embodiments.

The chip structure 220A is spaced apart from the chip structure 220B by a gap G1, in accordance with some embodiments. The gap G1 is over the shield bump structure 219 and the shield pad 118', in accordance with some embodiments. The shield bump structure 219 is wider than the gap G1, in accordance with some embodiments. The shield bump structure 219 extends across the gap G1, in accordance with some embodiments. The shield pad 118' extends across the gap G1, in accordance with some embodiments.

In some embodiments, as shown in FIG. 1F, a wire 116a of the wiring layer 116 extends across the gap G1, and the shield bump structure 219 and the shield pad 118' are both over the wire 116a under the gap G1. The wire 116a extends across sidewalls 222a of the chip structures 220A and 220B, and the shield bump structure 219 and the shield pad 118' cover the portions of the wire 116a under the sidewalls 222a, in accordance with some embodiments.

The chip structures 220A and 220B partially overlap the shield bump structure 219 and the shield pad 118', in accordance with some embodiments. In some embodiments, a portion of the shield bump structure 219 is between the chip structure 220A and the shield pad 118'. In some embodiments, another portion of the shield bump structure 219 is between the chip structure 220B and the shield pad 118'.

The chip structure 220A includes a chip-containing structure 222A and conductive bump structures 224 connected to the chip-containing structure 222A, in accordance with some embodiments. The chip structure 220B includes a chip-containing structure 222B and conductive bump structures 224 connected to the chip-containing structure 222B, in accordance with some embodiments.

Figures 1, 1F, 2:
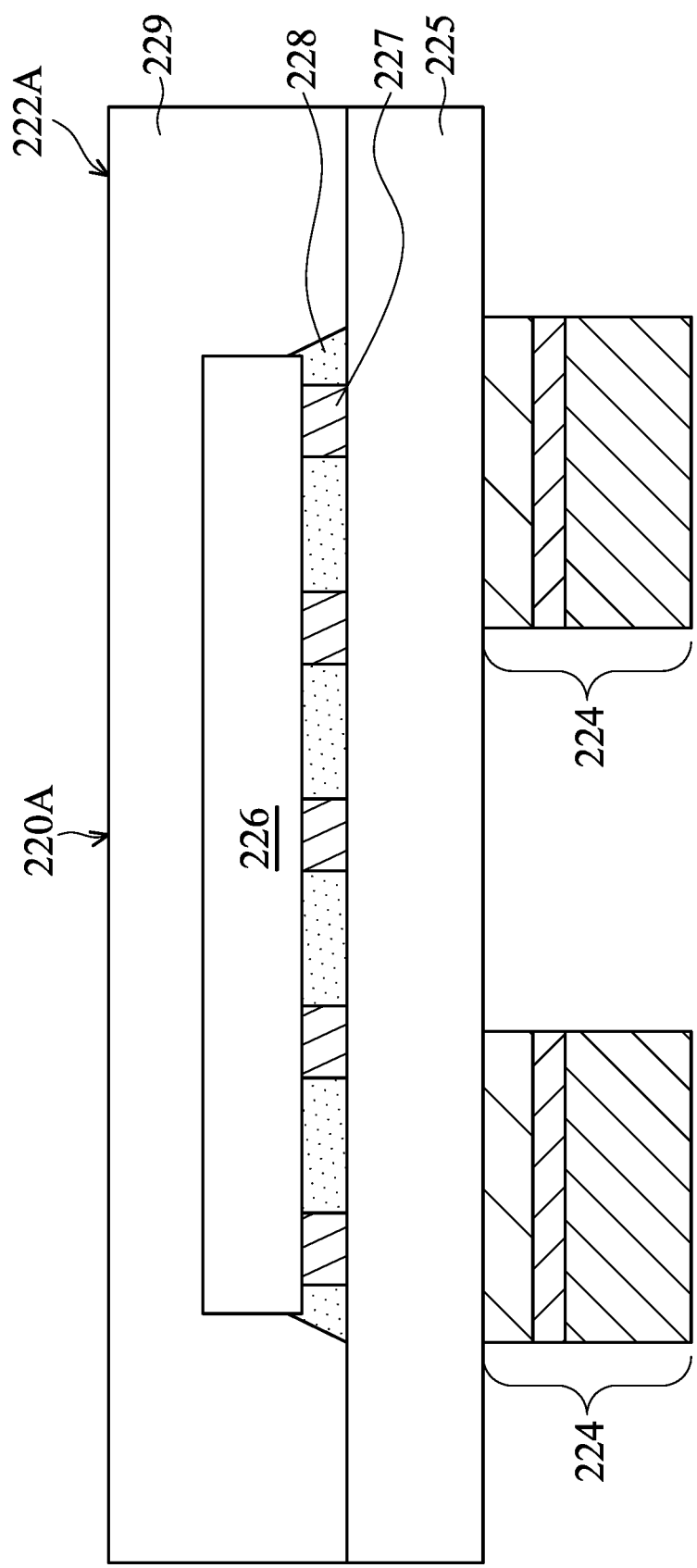

The chip-containing structure 222A or 222B includes a chip or a package with at least one chip, in accordance with some embodiments. For example, as shown in FIG. 1F-2, the chip-containing structure 222A includes a package including a wiring substrate 225, a chip 226, conductive pillars 227, an underfill layer 228, and a molding layer 229, in accordance with some embodiments. The chip 226 is bonded to the wiring substrate 225 through the conductive pillars 227, in accordance with some embodiments.

The underfill layer 228 is filled between the chip 226 and the wiring substrate 225, in accordance with some embodiments. The molding layer 229 is over the wiring substrate 225, the chip 226, and the underfill layer 228, in accordance with some embodiments. The chip 226 is made of, for example, a semiconductor material.

The conductive pillars 227 are made of a conductive material, in accordance with some embodiments. The underfill layer 228 and the molding layer 229 are made of different insulating materials, in accordance with some embodiments. Similarly, the chip-containing structure 222B may include a package similar to or the same as the package of 1F-2.

Each conductive bump structure 224 includes an under bump metallization layer 224a, a barrier layer 224b, and a conductive bump 224c, in accordance with some embodiments. The under bump metallization layer 224a is made of a conductive material, such as metal (e.g., titanium, copper, and/or nickel) or alloys thereof (e.g. titanium copper), in accordance with some embodiments. The barrier layer 224b is made of a conductive material, such as metal (e.g., tantalum) or nitrides (e.g. titanium nitride and/or tantalum nitride), in accordance with some embodiments. The conductive bump 224c is made of a conductive material, such as metal (e.g., titanium, copper, nickel, or aluminum) or alloys thereof, in accordance with some embodiments.

In some embodiments, a portion of the shield bump structure 219 under the chip structure 220A has a width W1. In some embodiments, a portion of the shield bump structure 219 under the chip structure 220B has a width W2. The width W1 or W2 ranges from about 60 μm to about 150 μm, in accordance with some embodiments.

In some embodiments, a ratio of the width W1 to a distance D3 between the conductive bump structure 224 and the sidewall 222a of the chip-containing structure 222A ranges from about 0.5 to less than about 1. In some embodiments, a ratio of the width W2 to a distance D4 between the conductive bump structure 224 and the sidewall 222a of the chip-containing structure 222B ranges from about 0.5 to less than about 1. If the ratio is less than about 0.5, the stress shielding ability of the shield bump structure 219 is not enough to protect the wires thereunder, in accordance with some embodiments.

Figure 1G:
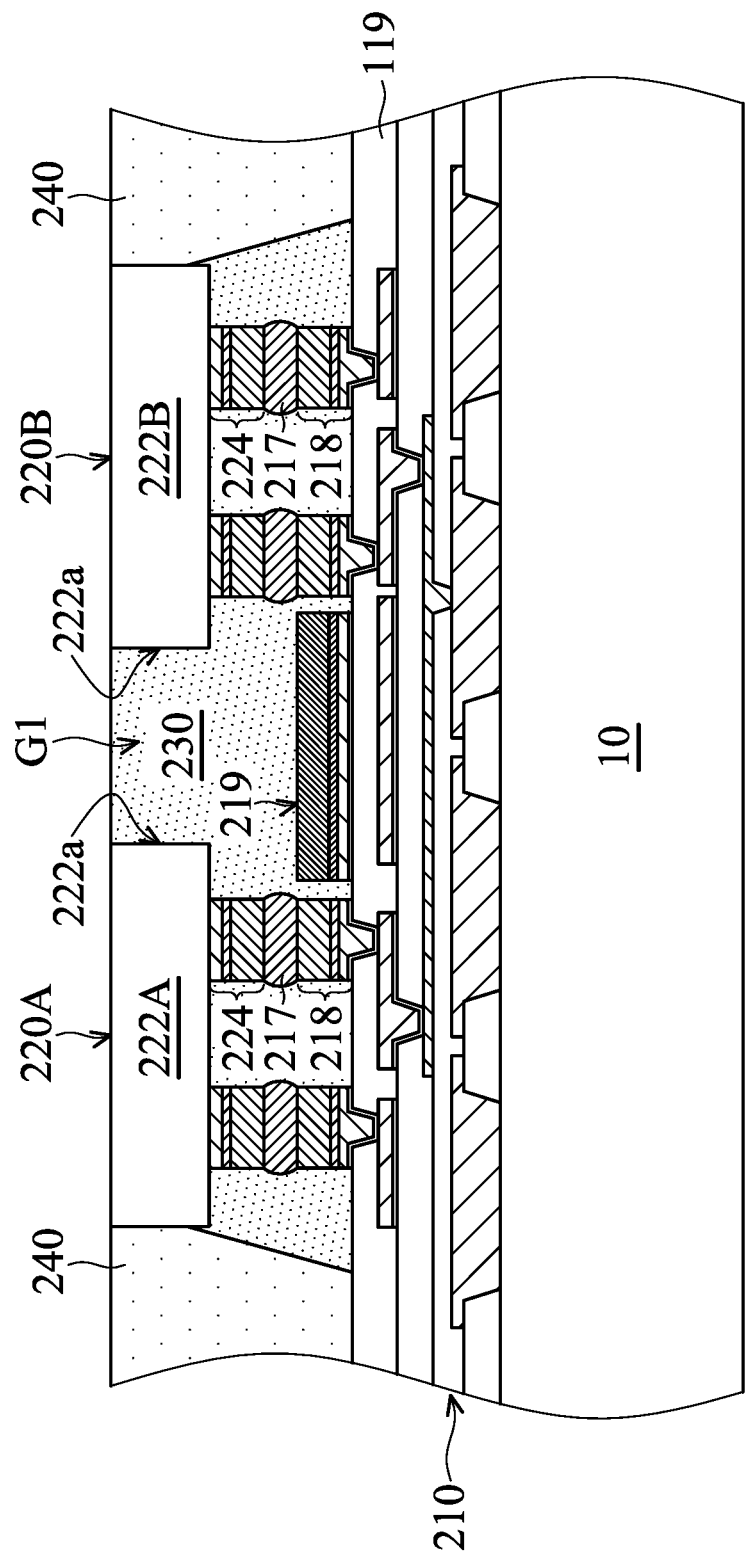

As shown in FIG. 1G, an underfill layer 230 is formed between the chip structures 220A and 220B and the redistribution structure 210, in accordance with some embodiments. The underfill layer 230 surrounds the chip structures 220A and 220B, the solder bumps 217, the conductive bump structures 218, and the shield bump structure 219, in accordance with some embodiments.

The underfill layer 230 extends into the gap G1 between the chip structures 220A and 220B, in accordance with some embodiments. The gap G1 is filled with the underfill layer 230, in accordance with some embodiments. The underfill layer 230 is made of an insulating material, such as a polymer material, in accordance with some embodiments.

As shown in FIG. 1G, the molding layer 240 is formed over the redistribution structure 210 and the underfill layer 230, in accordance with some embodiments. The molding layer 240 surrounds the chip structures 220A and 220B and the underfill layer 230, in accordance with some embodiments. The molding layer 240 is made of an insulating material, such as a polymer material (e.g., epoxy), in accordance with some embodiments.

Figure 1H:
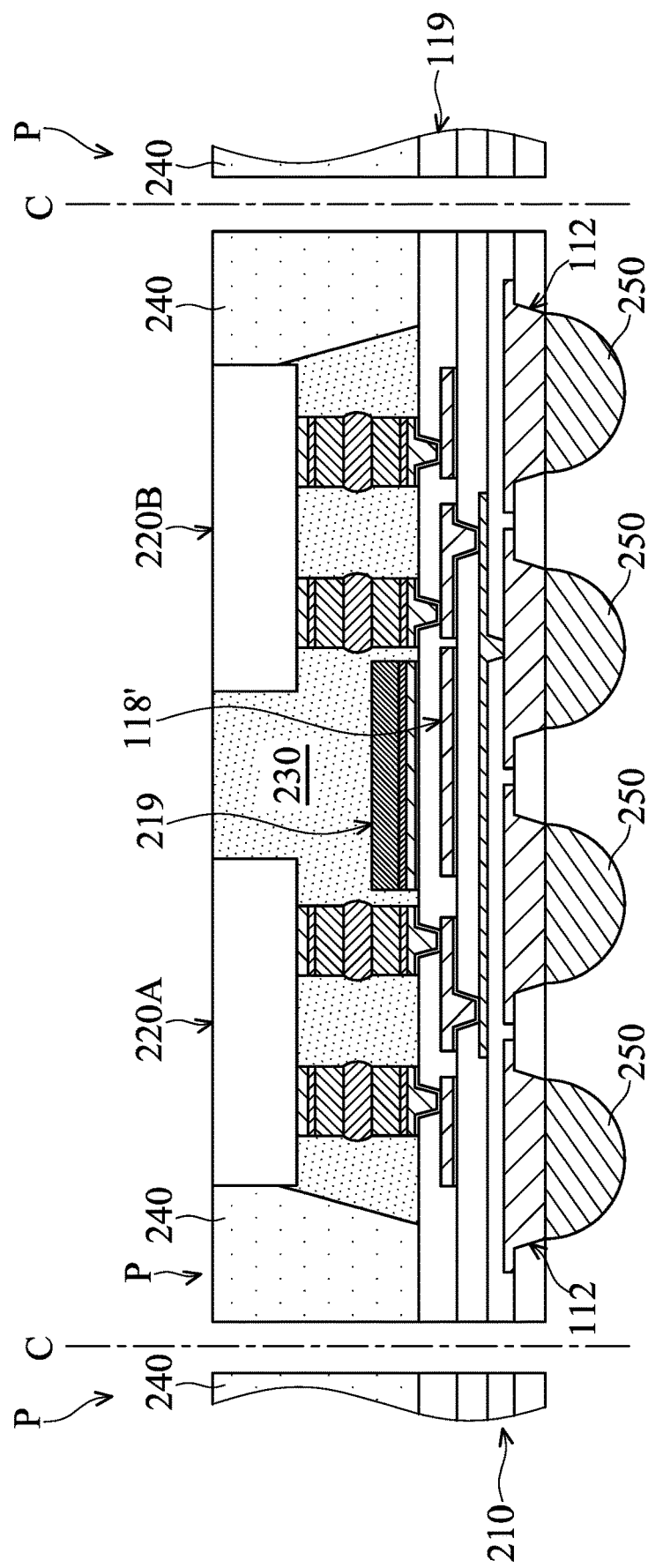

As shown in FIG. 1H, the carrier substrate 10 is removed, in accordance with some embodiments. As shown in FIG. 1H, bumps 250 are formed over the bonding pads 112, in accordance with some embodiments. The bumps 250 are made of a conductive material, such as a tin-based alloy, in accordance with some embodiments. The bumps 250 are formed using a plating process, such as an electroplating process, and a reflow process, in accordance with some embodiments.

As shown in FIG. 1H, a cutting process is performed to cut the redistribution structure 210, the dielectric layer 119, and the molding layer 240 along the cutting lines C to form chip package structures P, in accordance with some embodiments. The process of FIGS. 1A-1H is a wafer level packaging process, in accordance with some embodiments. For the sake of simplicity, FIGS. 1A-1H only show the structure for forming one of the chip package structures P, in accordance with some embodiments.

Figure 1I:
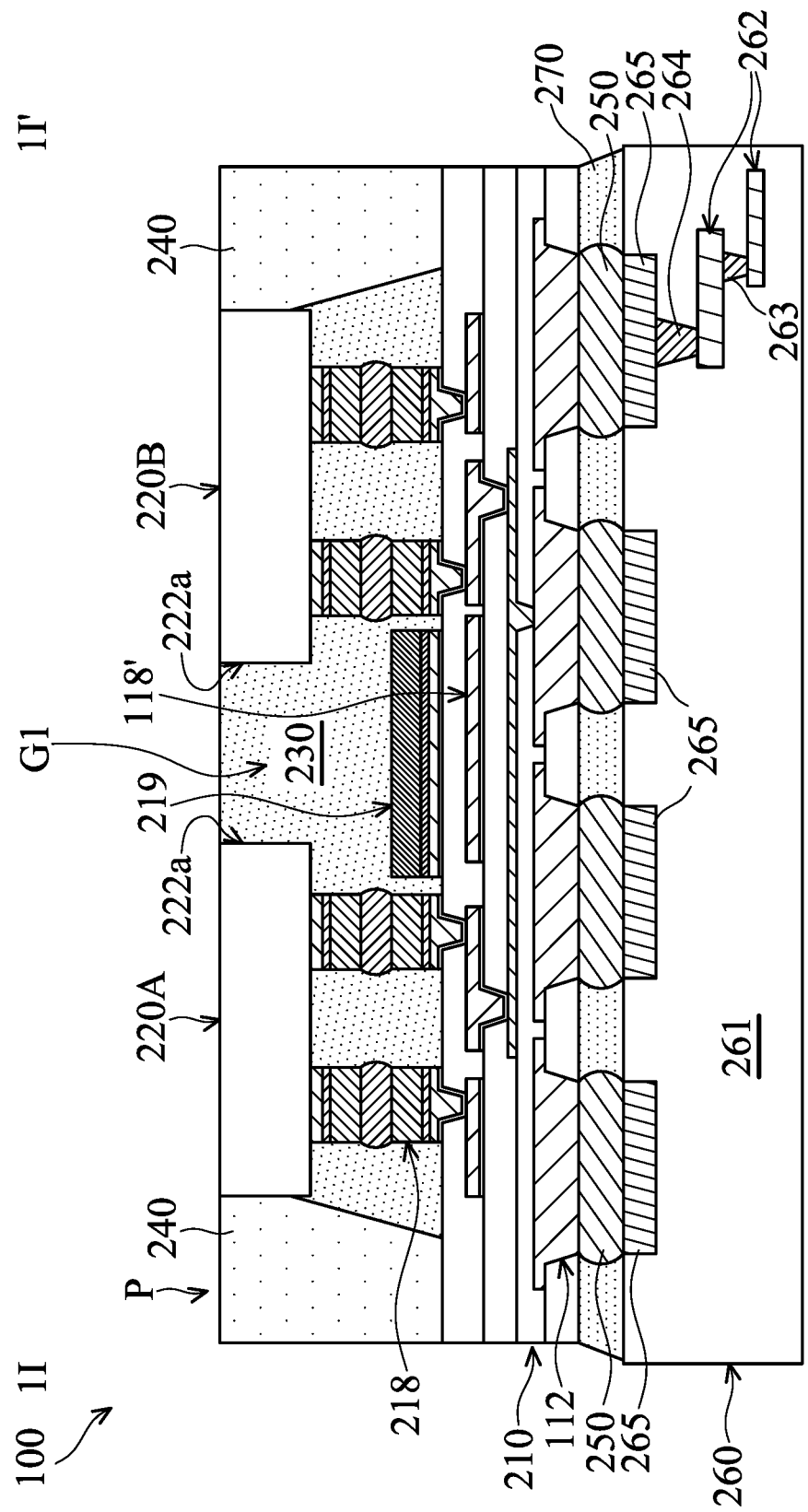
Figures 1, 1I:
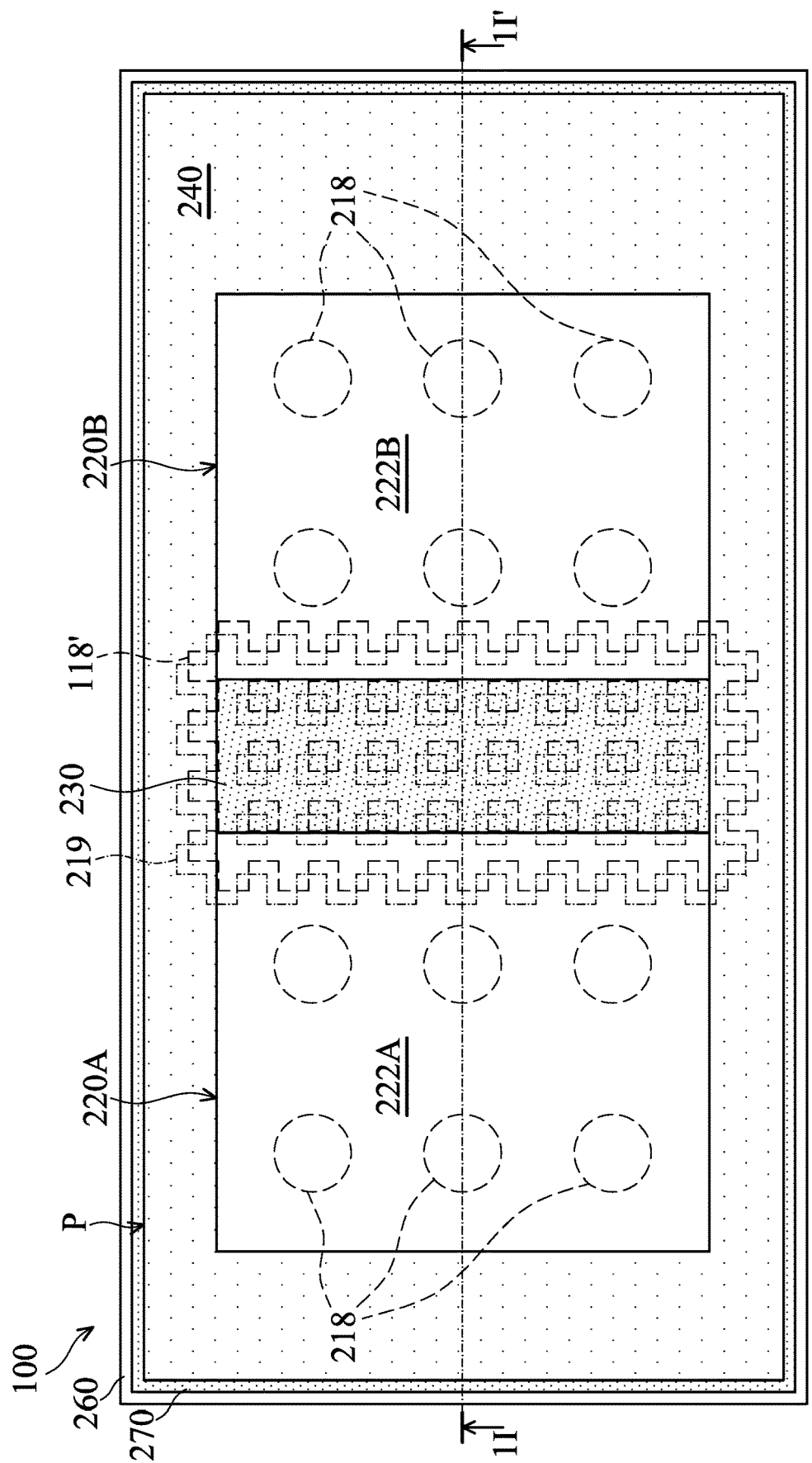
Figure 2:
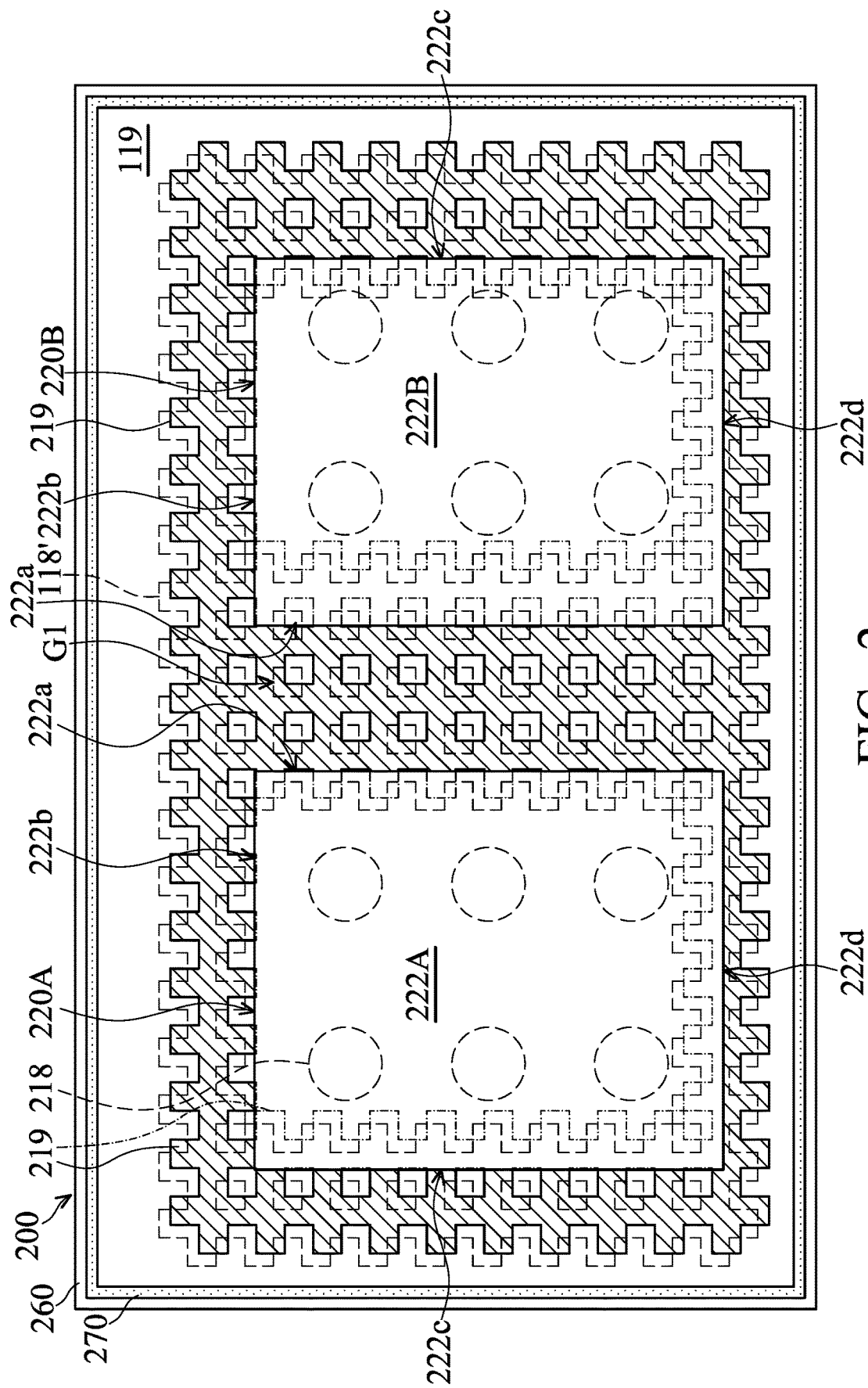

As shown in FIG. 1I, a wiring substrate 260 is provided, in accordance with some embodiments. The wiring substrate 260 includes a dielectric layer 261, wiring layers 262, conductive vias 263 and 264, and bonding pads 265, in accordance with some embodiments. The bonding pads 265 are formed over the dielectric layer 261, in accordance with some embodiments. The wiring layers 262 and the conductive vias 263 and 264 are formed in the dielectric layer 261, in accordance with some embodiments.

The conductive vias 263 are electrically connected between different wiring layers 262, in accordance with some embodiments. The conductive vias 264 are electrically connected between the wiring layer 262 and the bonding pads 265, in accordance with some embodiments. For the sake of simplicity, FIG. 1I only shows two of the wiring layers 262, in accordance with some embodiments.

The dielectric layer 261 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 261 is formed using deposition processes (e.g. chemical vapor deposition processes or physical vapor deposition processes), photolithography processes, and etching processes, in accordance with some embodiments.

The wiring layers 262 are made of a conductive material, such as metal (e.g. copper, aluminum, or tungsten) or alloys thereof, in accordance with some embodiments. The conductive vias 263 and 264 are made of a conductive material, such as metal (e.g. copper, aluminum, or tungsten) or alloys thereof, in accordance with some embodiments. The bonding pads 265 are made of a conductive material, such as metal (e.g. copper, aluminum, or tungsten) or alloys thereof, in accordance with some embodiments.

In some embodiments, the wiring layers 262, the conductive vias 263 and 264, and the bonding pads 265 are made of the same material. In some other embodiments. the wiring layers 262, the conductive vias 263 and 264, and the bonding pads 265 are made of different materials.

FIG. 1I-1 is a top view of the chip package structure of FIG. 1I, in accordance with some embodiments. FIG. 1I is a cross-sectional view illustrating the chip package structure along a sectional line 1I-1I' in FIG. 1I-1, in accordance with some embodiments. As shown in FIGS. 1I and 1I-1, the chip package structure P is bonded to the wiring substrate 260 through the bumps 250, in accordance with some embodiments. The bumps 250 are connected between the bonding pads 112 and 265, in accordance with some embodiments. The shield pad 118' and the shield bump structure 219 are electrically insulated from the wiring substrate 260, in accordance with some embodiments. In this step, a chip package structure 100 is substantially formed, in accordance with some embodiments.

The thermal expansion coefficient of the chip structures 220A and 220B is different from (e.g., less than) that of the wiring substrate 260, in accordance with some embodiments. The mismatch of thermal expansion coefficients between the chip structures 220A and 220B and the wiring substrate 260 may induce a thermal stress in the redistribution structure 210, especially in the portion of the redistribution structure 210 under the gap G1 or the sidewalls 222a, in accordance with some embodiments. The thermal stress tends to result in cracks in the wires extending across the gap G1 or the sidewalls 222a, in accordance with some embodiments. Since the stress is concentrated in the gap G1 or on the sidewalls 222a, the shield bump structure 219 and the shield pad 118' are able to shield the stress to protect the wires thereunder, in accordance with some embodiments. Therefore, the shield bump structure 219 and the shield pad 118' improve the reliability of the chip package structure 100, in accordance with some embodiments.

FIG. 2 is a top view of a chip package structure 200, in accordance with some embodiments. For the sake of simplicity, FIG. 2 does not show the underfill layer and the molding layer, in accordance with some embodiments. As shown in FIG. 2, the chip package structure 200 is similar to the chip package structure 100 of FIG. 1I-1, except that the shield bump structure 219 and the shield pad 118' of the chip package structure 200 are further under the sidewalls 222b, 222c, and 222d of the chip structures 220A and 220B, in accordance with some embodiments.

Figure 3:
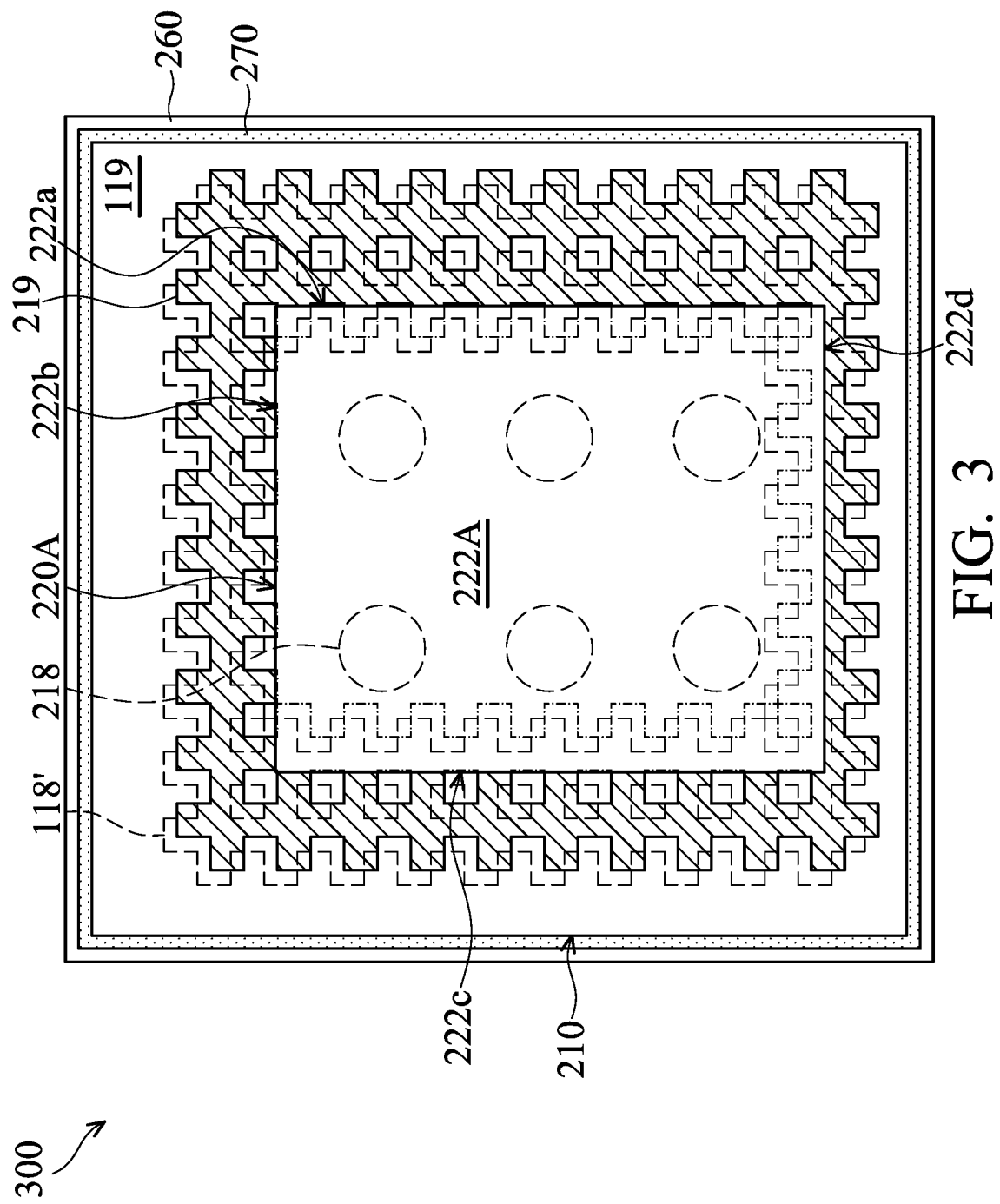

FIG. 3 is a top view of a chip package structure 300, in accordance with some embodiments. For the sake of simplicity, FIG. 3 does not show the underfill layer and the molding layer, in accordance with some embodiments. As shown in FIG. 3, the chip package structure 300 is similar to the chip package structure 200 of FIG. 2, except that the chip package structure 300 only has the chip structure 220A and does not have the chip structure 220B, in accordance with some embodiments.

Figure 4:
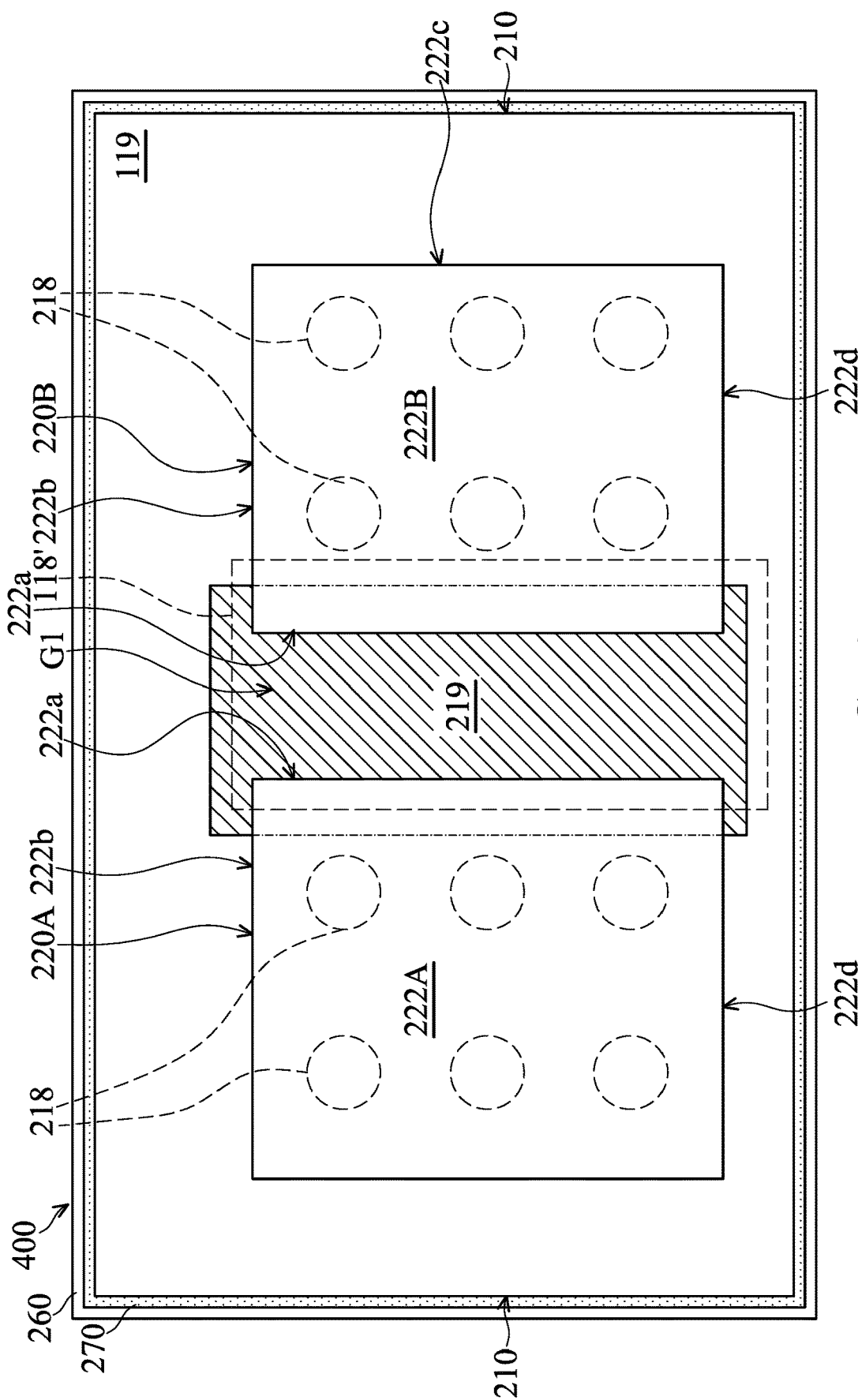

FIG. 4 is a top view of a chip package structure 400, in accordance with some embodiments. For the sake of simplicity, FIG. 4 does not show the underfill layer and the molding layer, in accordance with some embodiments. As shown in FIG. 4, the chip package structure 400 is similar to the chip package structure 100 of FIG. 1I-1, except that the shield bump structure 219 and the shield pad 118' of the chip package structure 400 have a rectangular shape, in accordance with some embodiments.

Figure 5:
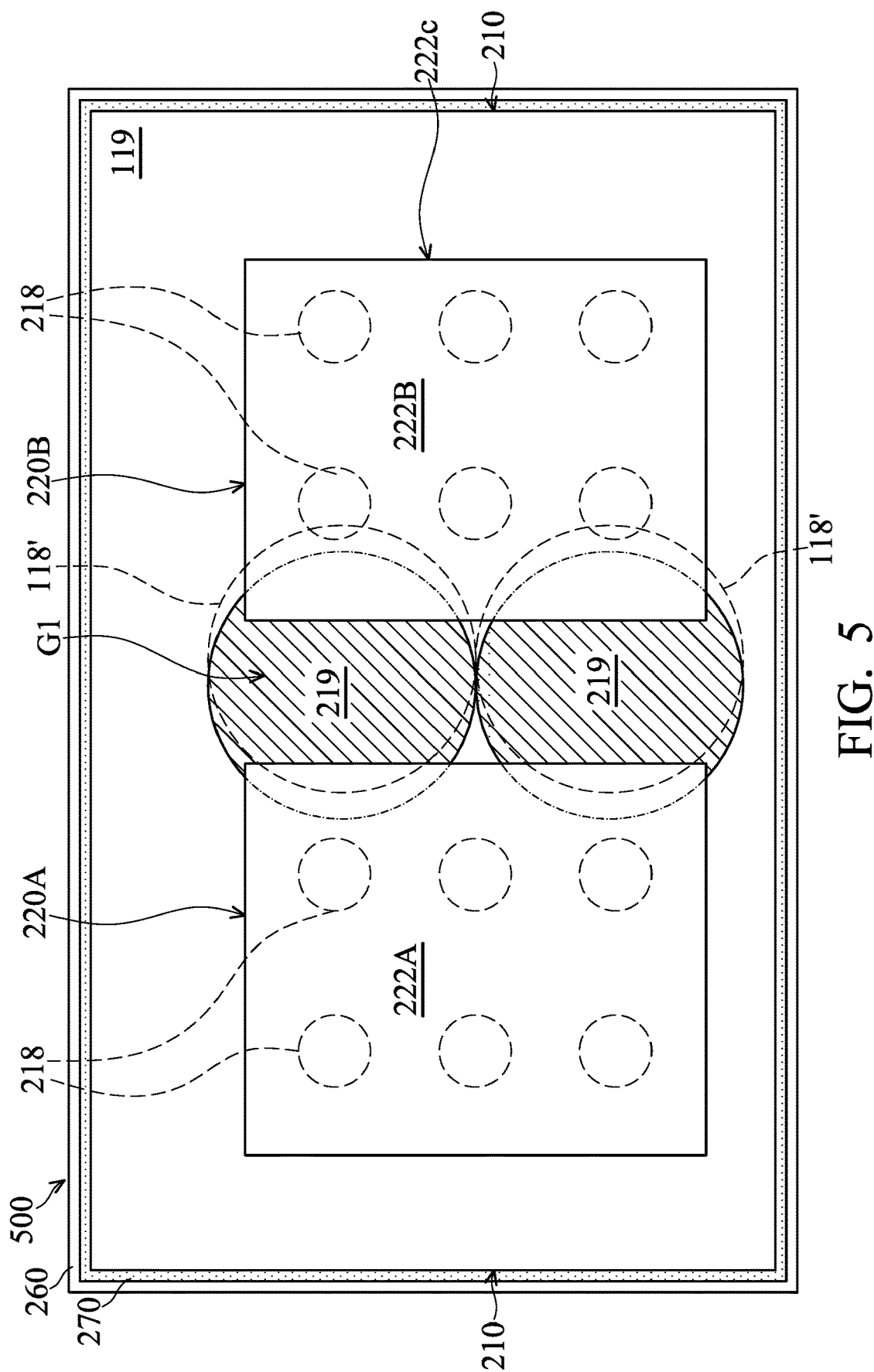

FIG. 5 is a top view of a chip package structure 500, in accordance with some embodiments. For the sake of simplicity, FIG. 5 does not show the underfill layer and the molding layer, in accordance with some embodiments. As shown in FIG. 5, the chip package structure 500 is similar to the chip package structure 100 of FIG. 1I-1, except that the shield bump structure 219 and the shield pad 118' of the chip package structure 500 have a round shape, in accordance with some embodiments.

Figure 6:
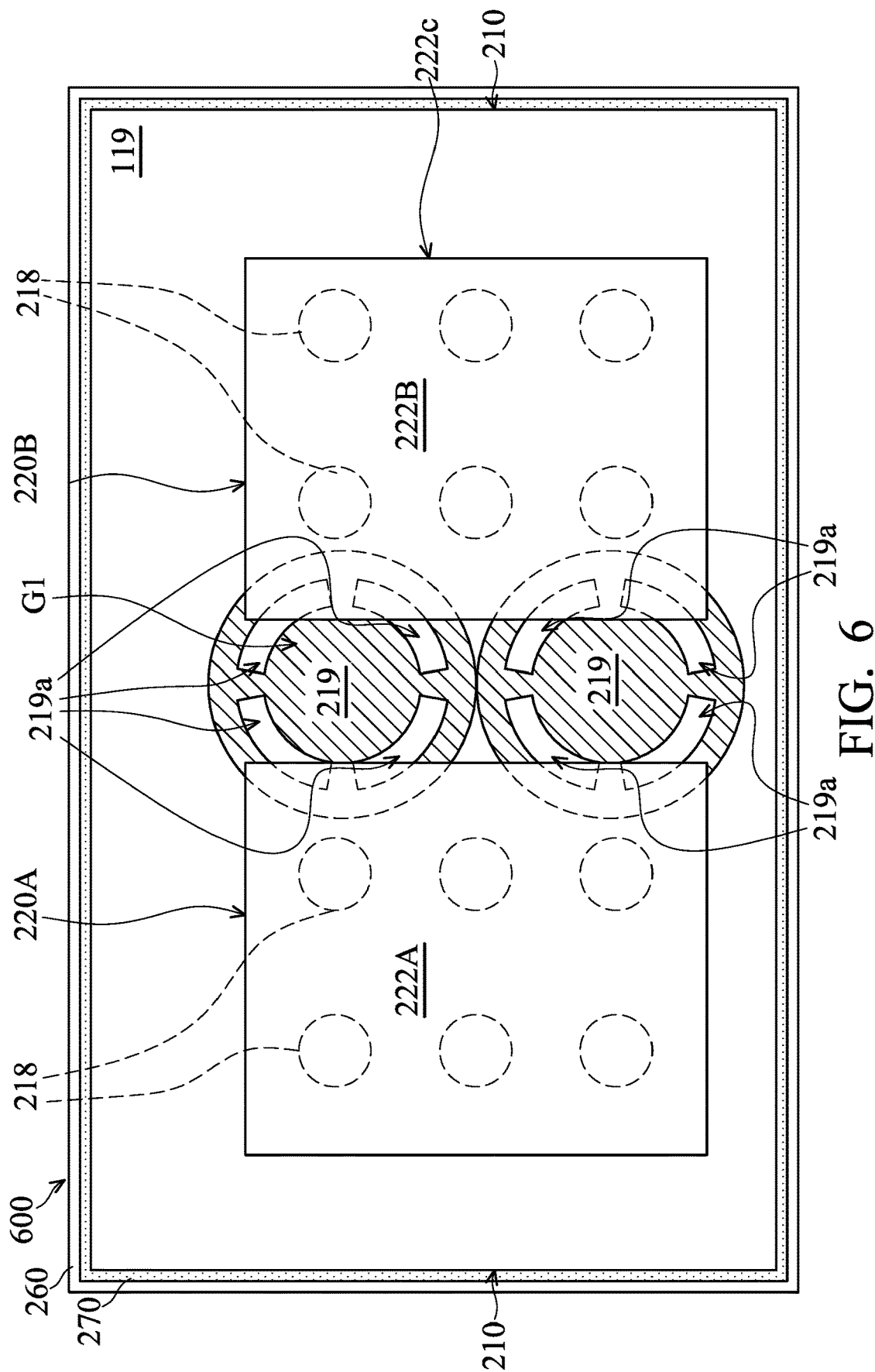

FIG. 6 is a top view of a chip package structure 600, in accordance with some embodiments. For the sake of simplicity, FIG. 6 does not show the underfill layer and the molding layer, in accordance with some embodiments. As shown in FIG. 6, the chip package structure 600 is similar to the chip package structure 500 of FIG. 5, except that the shield bump structure 219 has holes 219a, in accordance with some embodiments.

For the sake of simplicity, FIG. 6 does not show the shield pad 118', in accordance with some embodiments. In some embodiments, the shield pad 118' and the shield bump structure 219 have the same shape.

Figure 7:
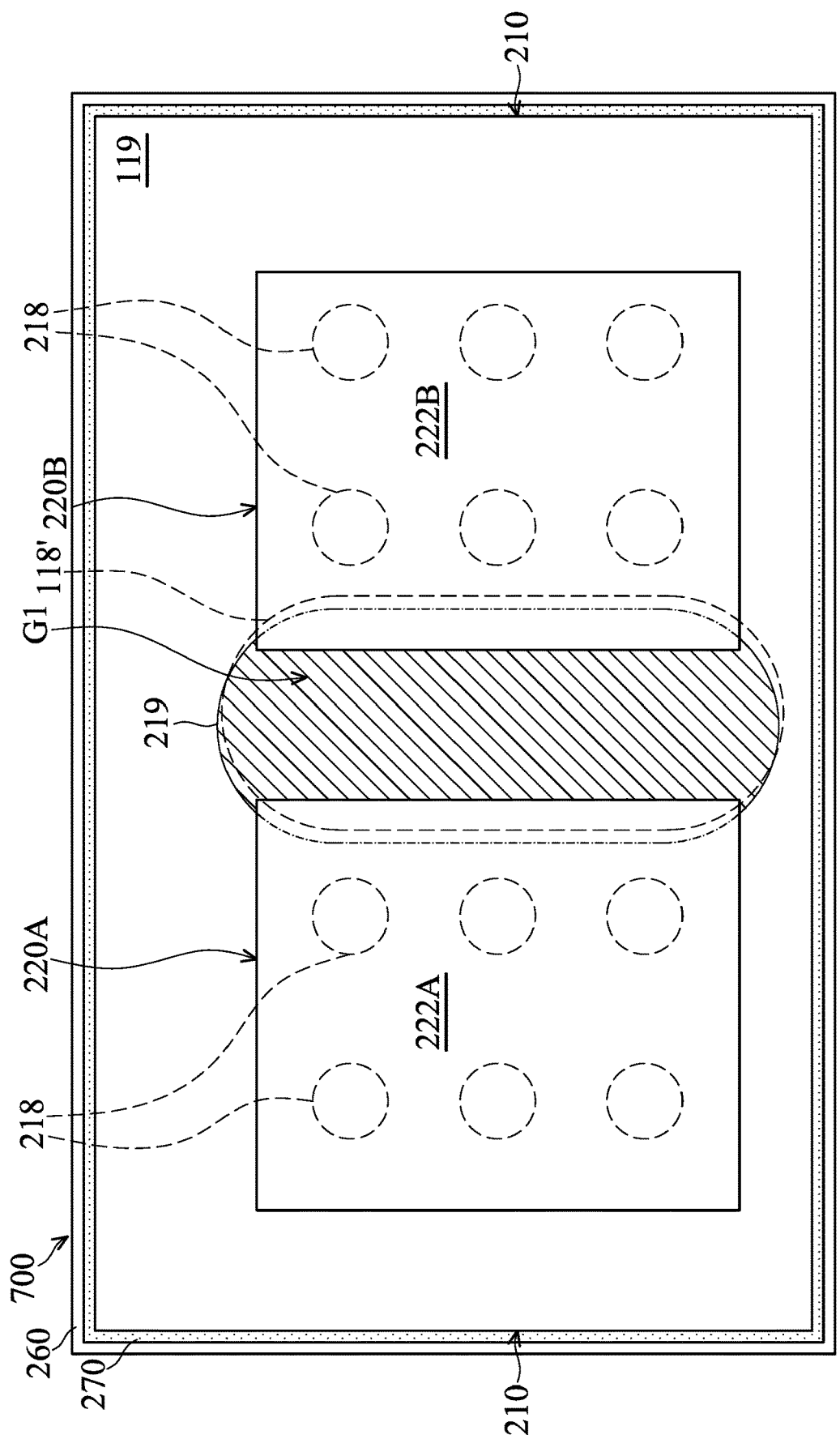

FIG. 7 is a top view of a chip package structure 700, in accordance with some embodiments. For the sake of simplicity, FIG. 7 does not show the underfill layer and the molding layer, in accordance with some embodiments. As shown in FIG. 7, the chip package structure 700 is similar to the chip package structure 100 of FIG. 1I-1, except that the shield bump structure 219 and the shield pad 118' of the chip package structure 700 have an oval-like shape, in accordance with some embodiments.

Figure 8:
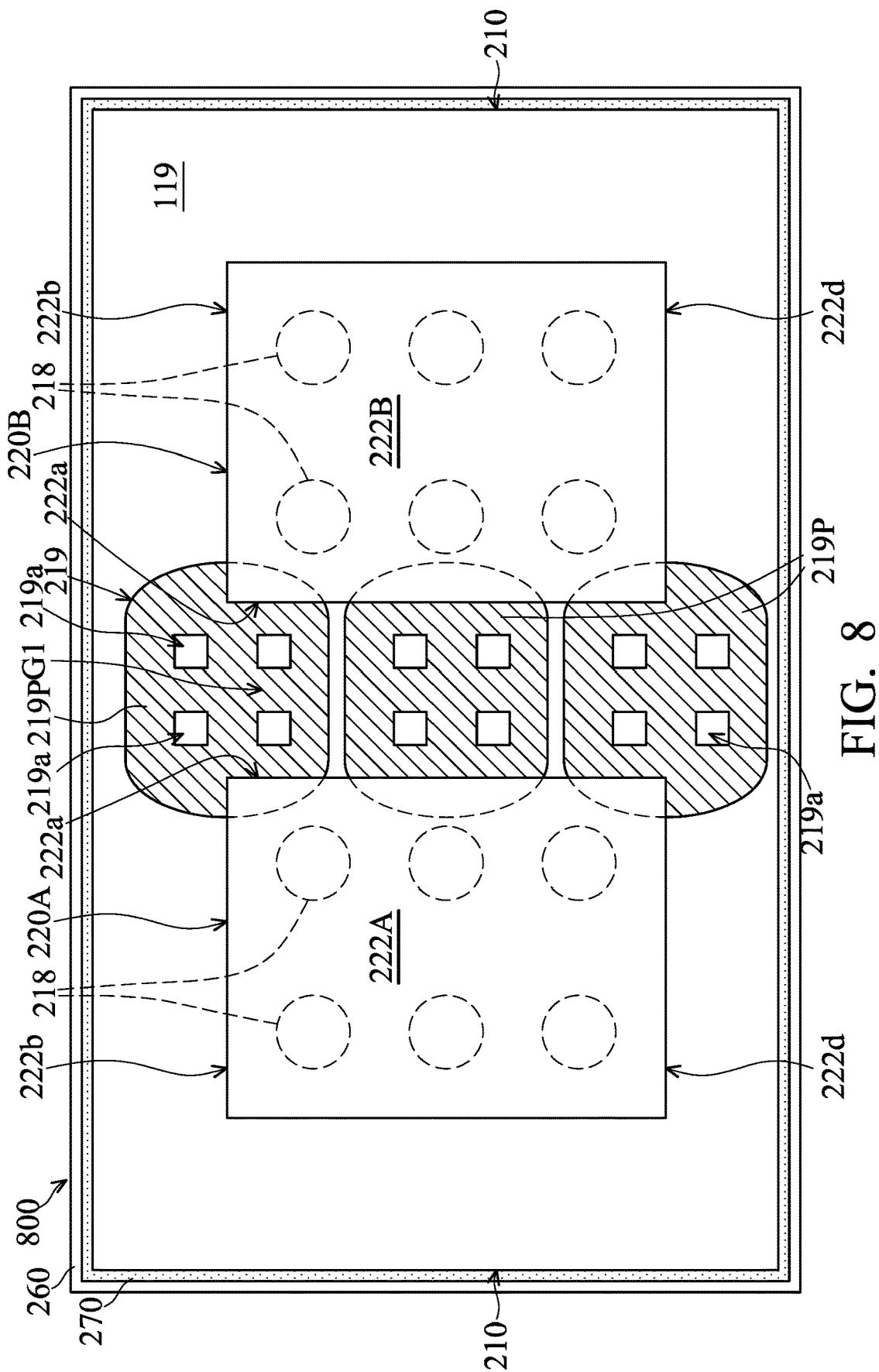

FIG. 8 is a top view of a chip package structure 800, in accordance with some embodiments. For the sake of simplicity, FIG. 8 does not show the underfill layer and the molding layer, in accordance with some embodiments. As shown in FIG. 8, the chip package structure 800 is similar to the chip package structure 700 of FIG. 7, except that the shield bump structure 219 of the chip package structure 800 have portions 219P spaced apart from each other, in accordance with some embodiments. The portions 219P have an oval-like shape, in accordance with some embodiments. The portions 219P have holes 219a, in accordance with some embodiments.

For the sake of simplicity, FIG. 8 does not show the shield pad 118', in accordance with some embodiments. In some embodiments, the shield pad 118' and the shield bump structure 219 have the same shape.

Figure 9:
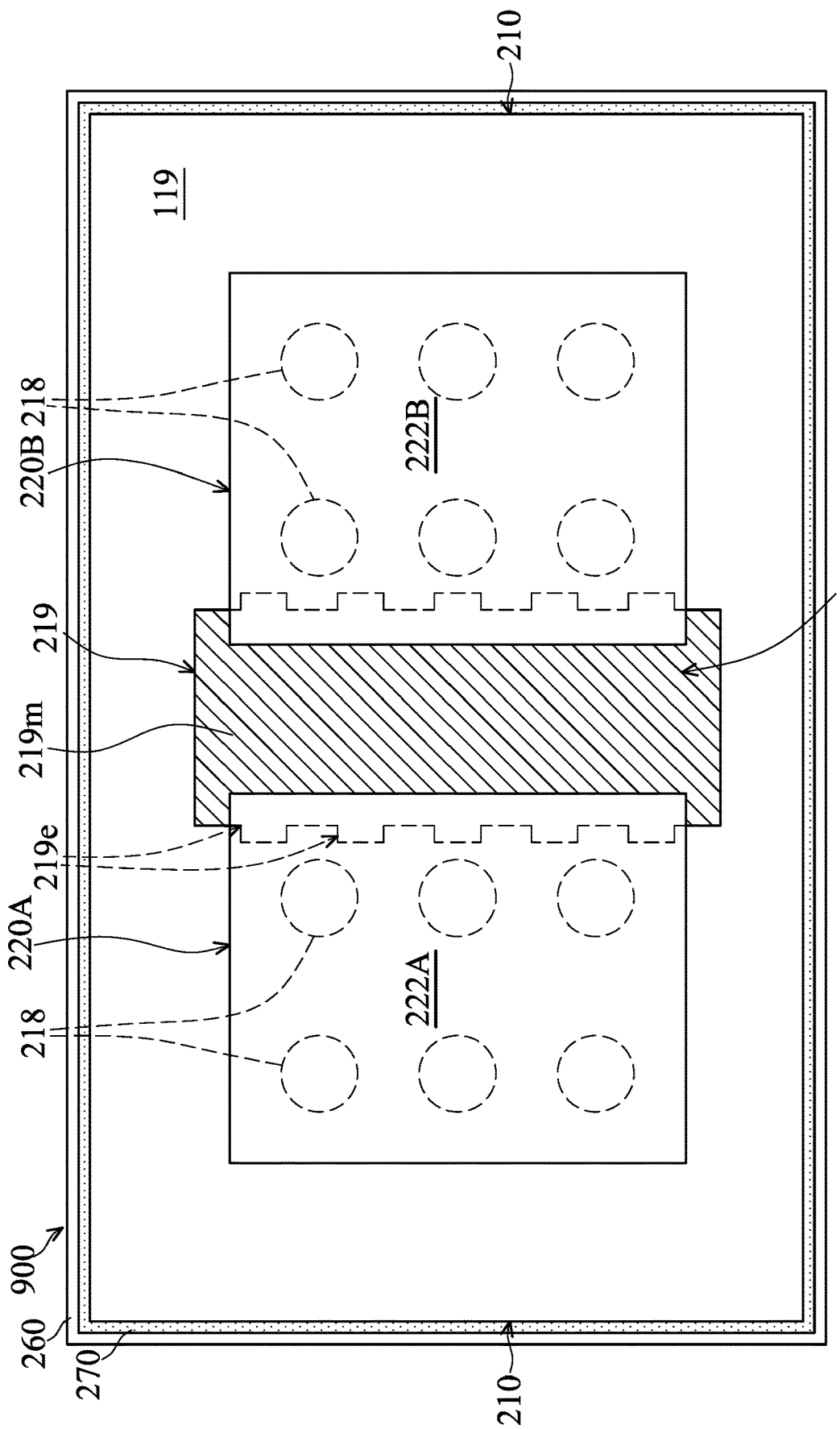

FIG. 9 is a top view of a chip package structure 900, in accordance with some embodiments. For the sake of simplicity, FIG. 9 does not show the underfill layer and the molding layer, in accordance with some embodiments. As shown in FIG. 9, the chip package structure 900 is similar to the chip package structure 400 of FIG. 4, except that the shield bump structure 219 of the chip package structure 900 have a main portion 219m and extending portions 219e connected to the main portion 219m, in accordance with some embodiments. The extending portions 219e are under the chip-containing structures 222A and 222B, in accordance with some embodiments. The main portion 219m and the extending portions 219e have a rectangular shape, in accordance with some embodiments.

For the sake of simplicity, FIG. 9 does not show the shield pad 118', in accordance with some embodiments. In some embodiments, the shield pad 118' and the shield bump structure 219 have the same shape.

Figure 10:
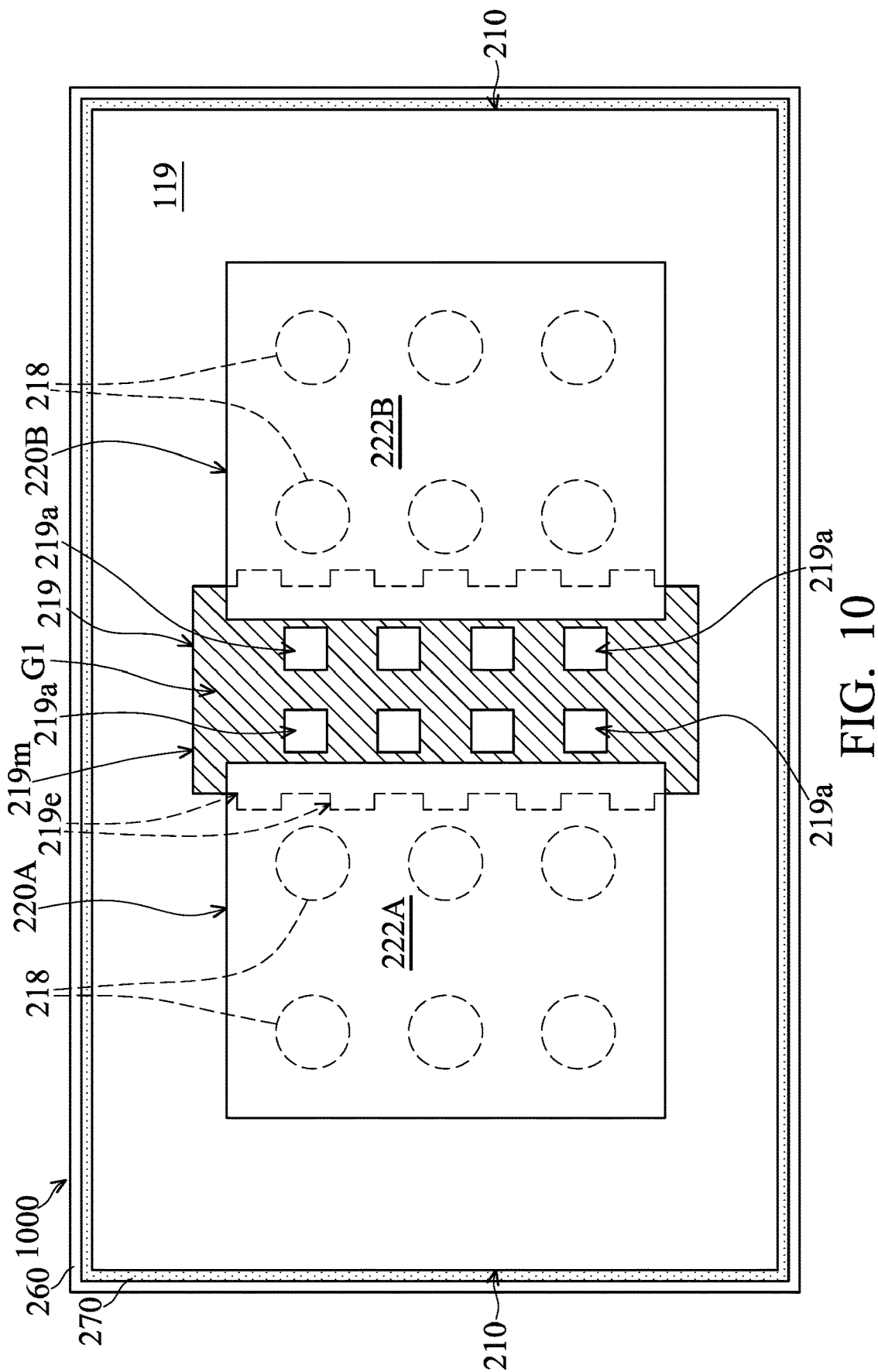

FIG. 10 is a top view of a chip package structure 1000, in accordance with some embodiments. For the sake of simplicity, FIG. 10 does not show the underfill layer and the molding layer, in accordance with some embodiments. As shown in FIG. 10, the chip package structure 1000 is similar to the chip package structure 900 of FIG. 9, except that the shield bump structure 219 of the chip package structure 1000 have holes 219a, in accordance with some embodiments.

For the sake of simplicity, FIG. 10 does not show the shield pad 118', in accordance with some embodiments. In some embodiments, the shield pad 118' and the shield bump structure 219 have the same shape.

Figure 11:
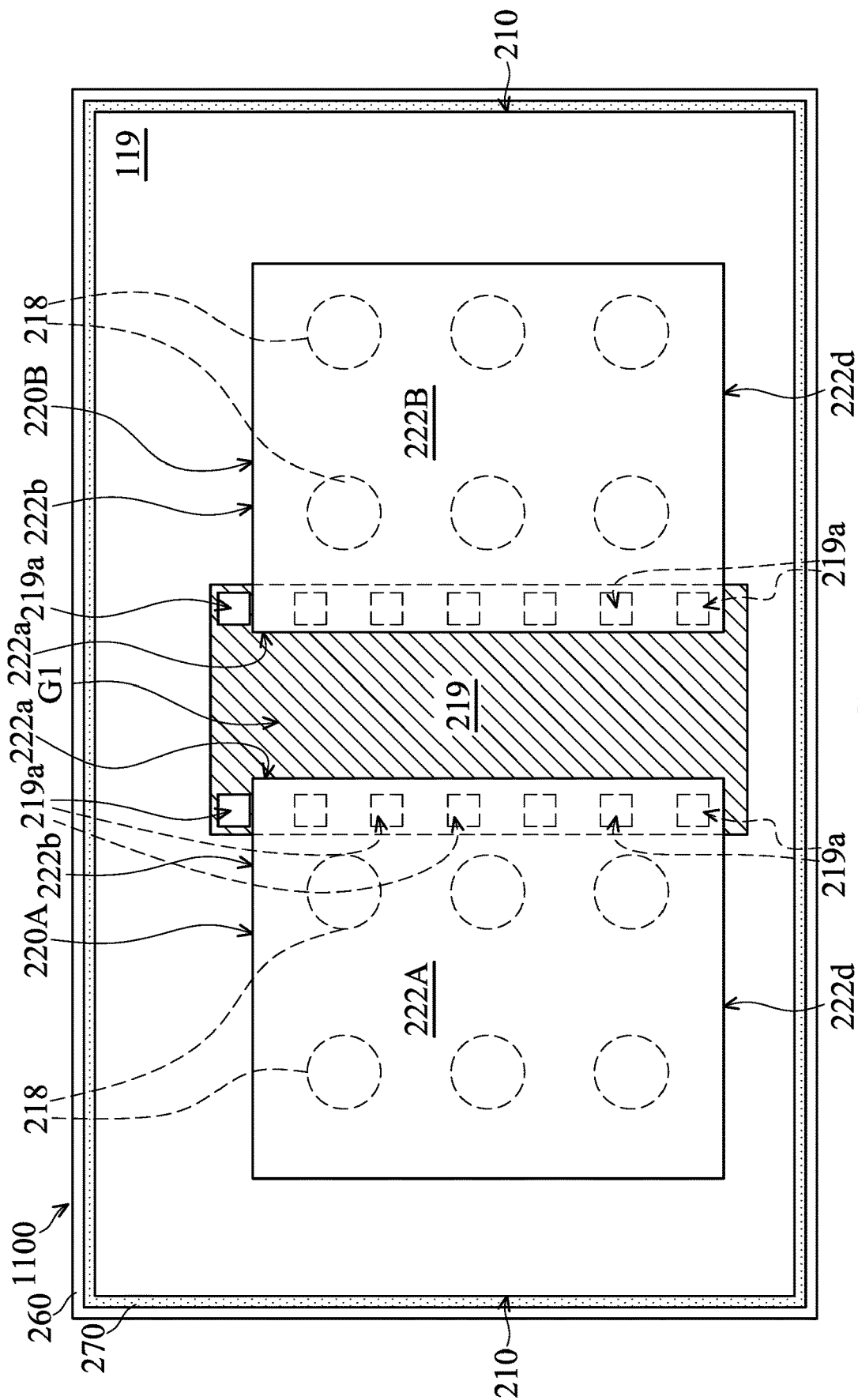

FIG. 11 is a top view of a chip package structure 1100, in accordance with some embodiments. For the sake of simplicity, FIG. 11 does not show the underfill layer and the molding layer, in accordance with some embodiments. As shown in FIG. 11, the chip package structure 1100 is similar to the chip package structure 400 of FIG. 4, except that the shield bump structure 219 of the chip package structure 1100 have holes 219a, in accordance with some embodiments. For the sake of simplicity, FIG. 11 does not show the shield pad 118', in accordance with some embodiments. In some embodiments, the shield pad 118' and the shield bump structure 219 have the same shape.

Figure 12:
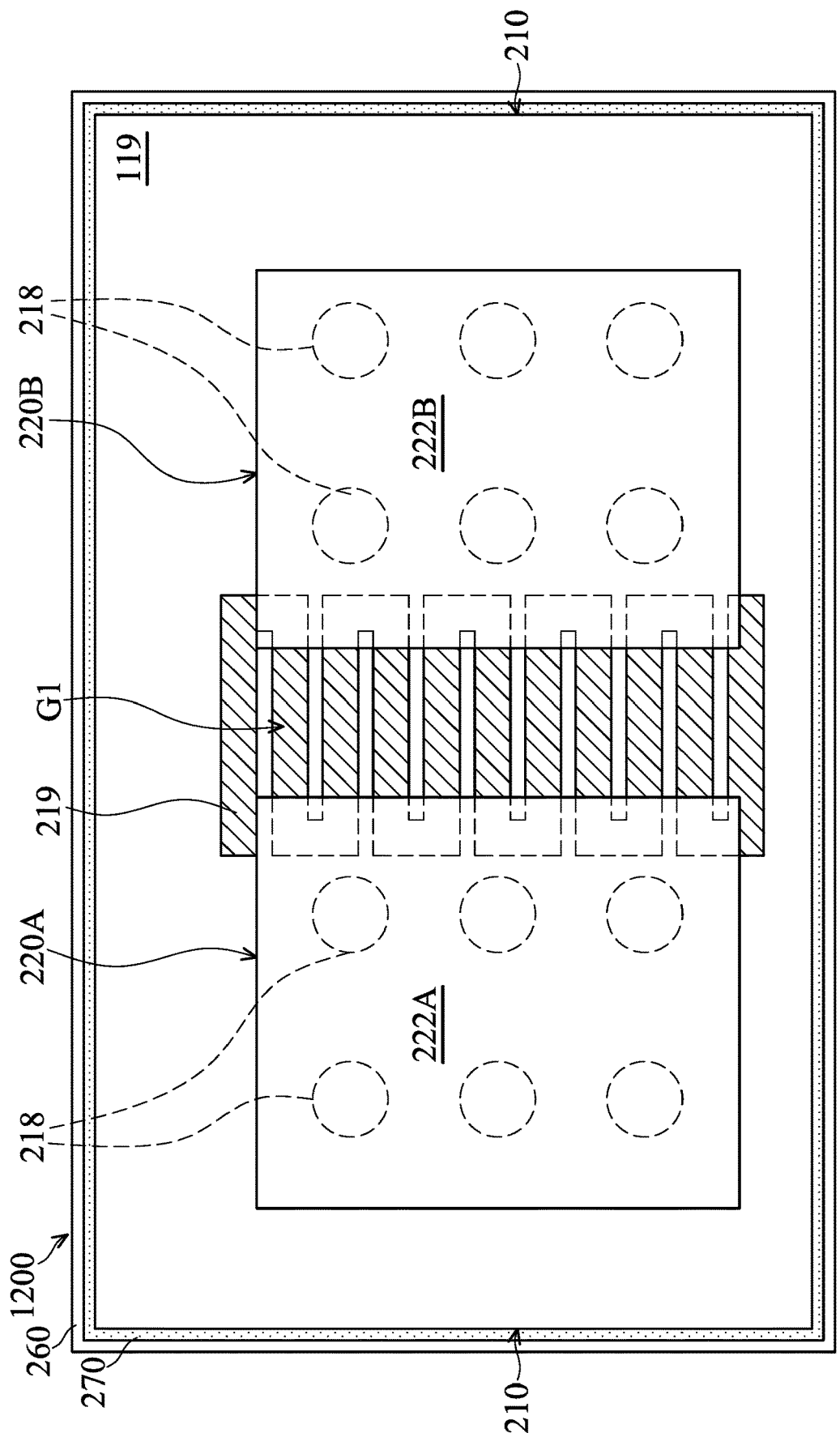

FIG. 12 is a top view of a chip package structure 1200, in accordance with some embodiments. For the sake of simplicity, FIG. 12 does not show the underfill layer and the molding layer, in accordance with some embodiments. As shown in FIG. 12, the chip package structure 1200 is similar to the chip package structure 400 of FIG. 4, except that the shield bump structure 219 of the chip package structure 1200 has a serpentine line, and the main portion of the serpentine line laterally extends across the gap G1 between the chip structures 220A and 220B, in accordance with some embodiments. For the sake of simplicity, FIG. 12 does not show the shield pad 118', in accordance with some embodiments. In some embodiments, the shield pad 118' and the shield bump structure 219 have the same shape.

Figure 13:
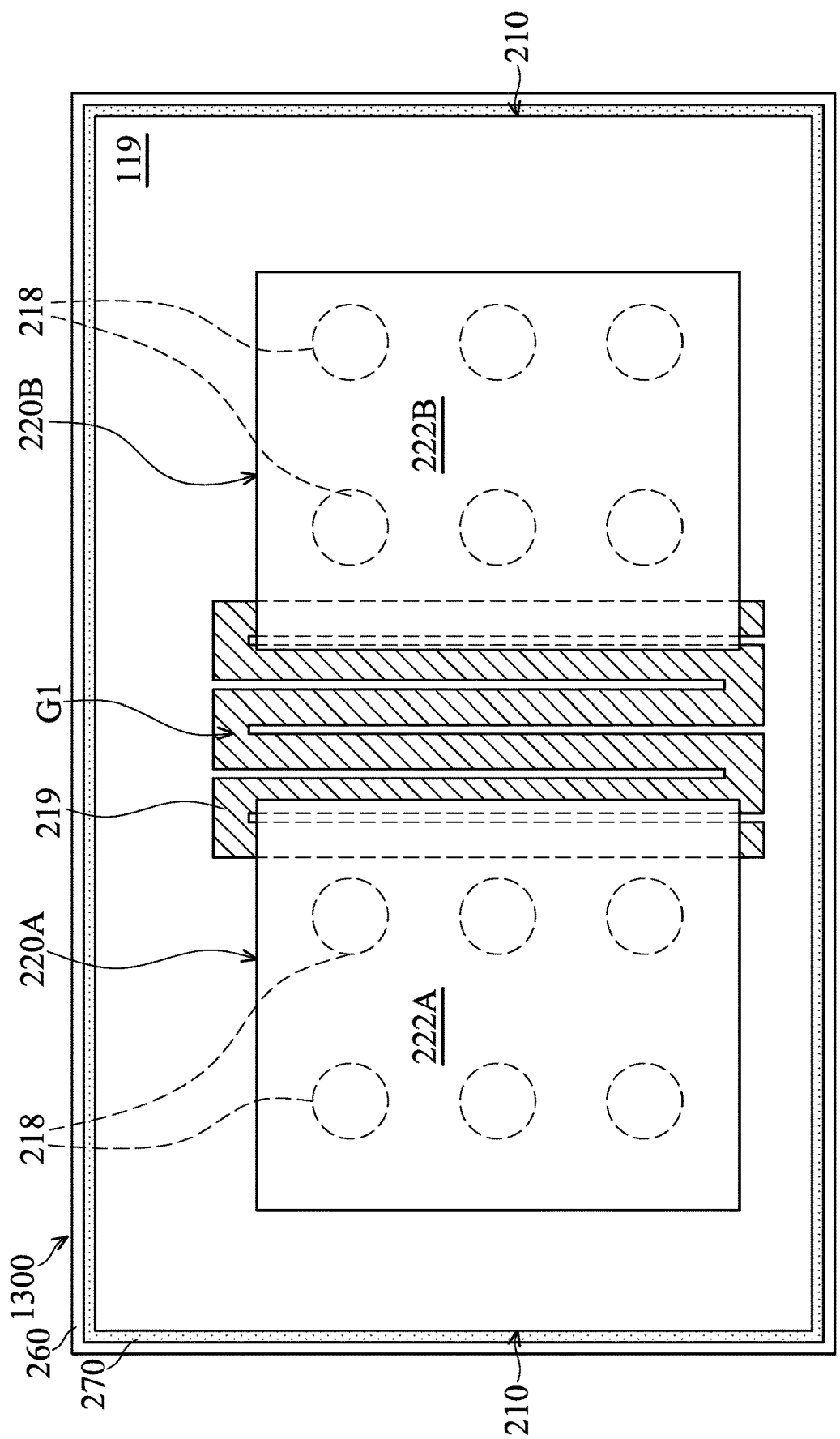

FIG. 13 is a top view of a chip package structure 1300, in accordance with some embodiments. For the sake of simplicity, FIG. 13 does not show the underfill layer and the molding layer, in accordance with some embodiments. As shown in FIG. 13, the chip package structure 1300 is similar to the chip package structure 1200 of FIG. 12, except that the shield bump structure 219 of the chip package structure 1300 has a serpentine line, and the main portion of the serpentine line extends vertically, in accordance with some embodiments. For the sake of simplicity, FIG. 13 does not show the shield pad 118', in accordance with some embodiments. In some embodiments, the shield pad 118' and the shield bump structure 219 have the same shape.

Figure 14:
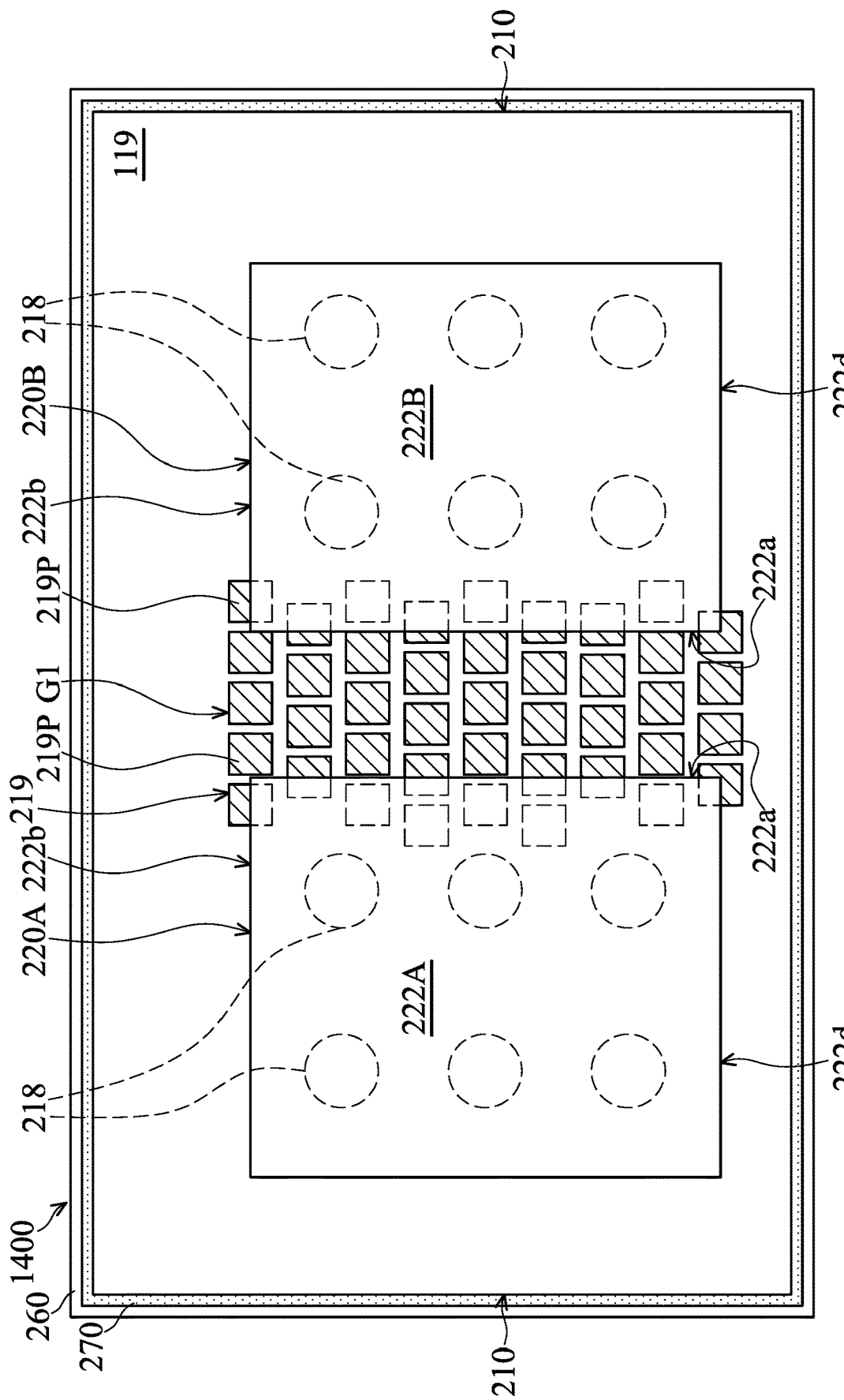

FIG. 14 is a top view of a chip package structure 1400, in accordance with some embodiments. For the sake of simplicity, FIG. 14 does not show the underfill layer and the molding layer, in accordance with some embodiments. As shown in FIG. 14, the chip package structure 1400 is similar to the chip package structure 400 of FIG. 4, except that the shield bump structure 219 of the chip package structure 1400 has portions 219P spaced apart from each other, in accordance with some embodiments. The portions 219P have a rectangular shape, in accordance with some embodiments. For the sake of simplicity, FIG. 14 does not show the shield pad 118', in accordance with some embodiments. In some embodiments, the shield pad 118' and the shield bump structure 219 have the same shape.

Figure 15A:
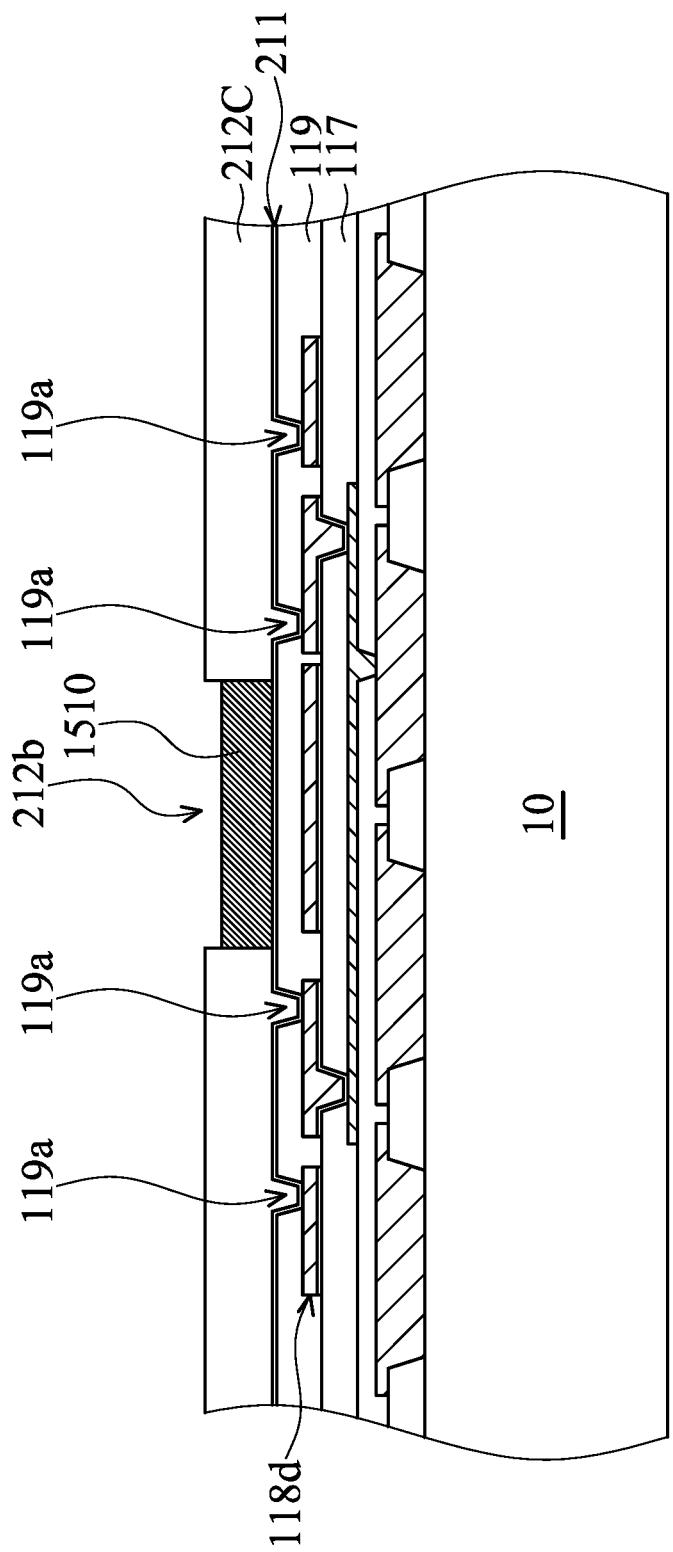
Figure 15B:
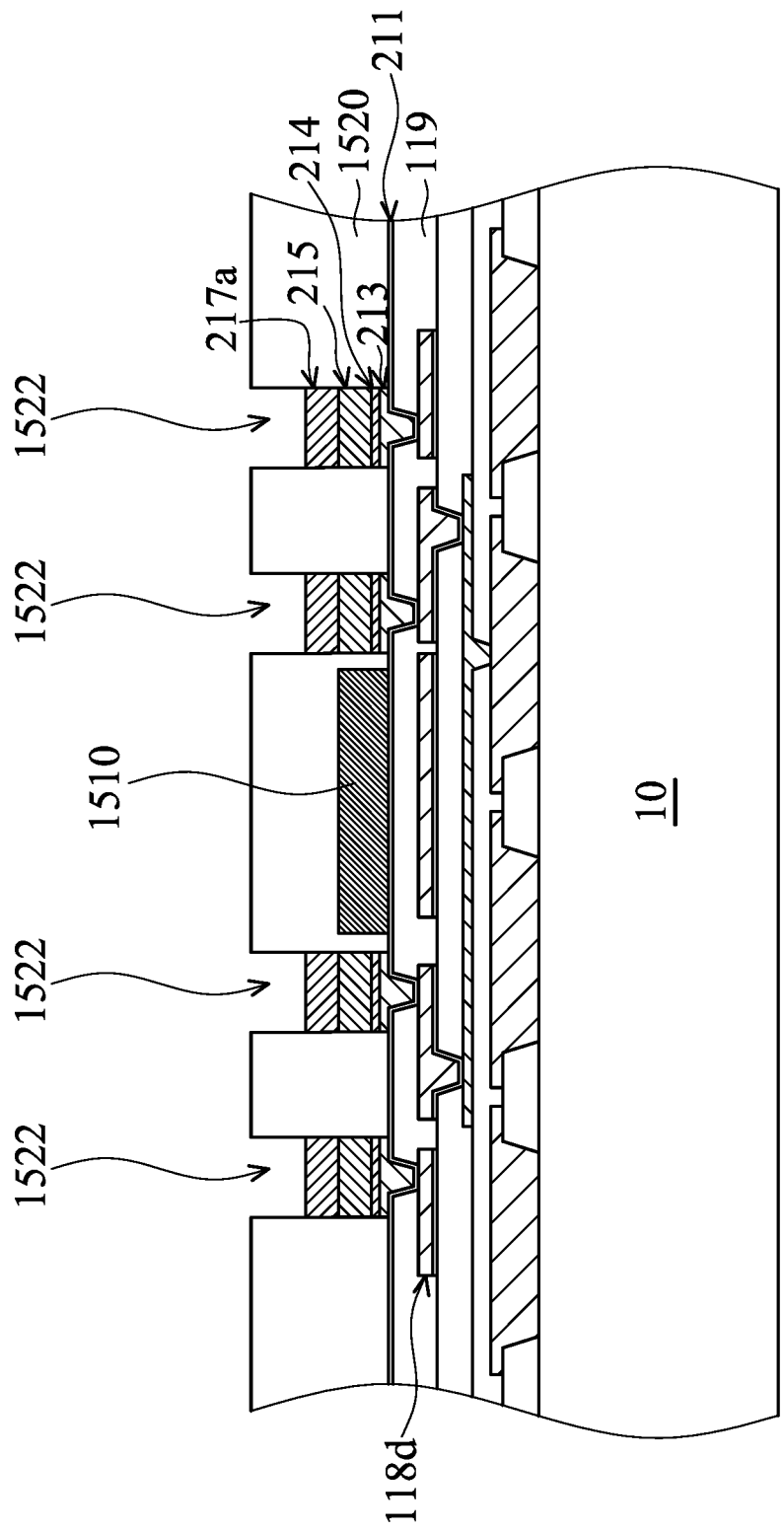
Figure 15C:
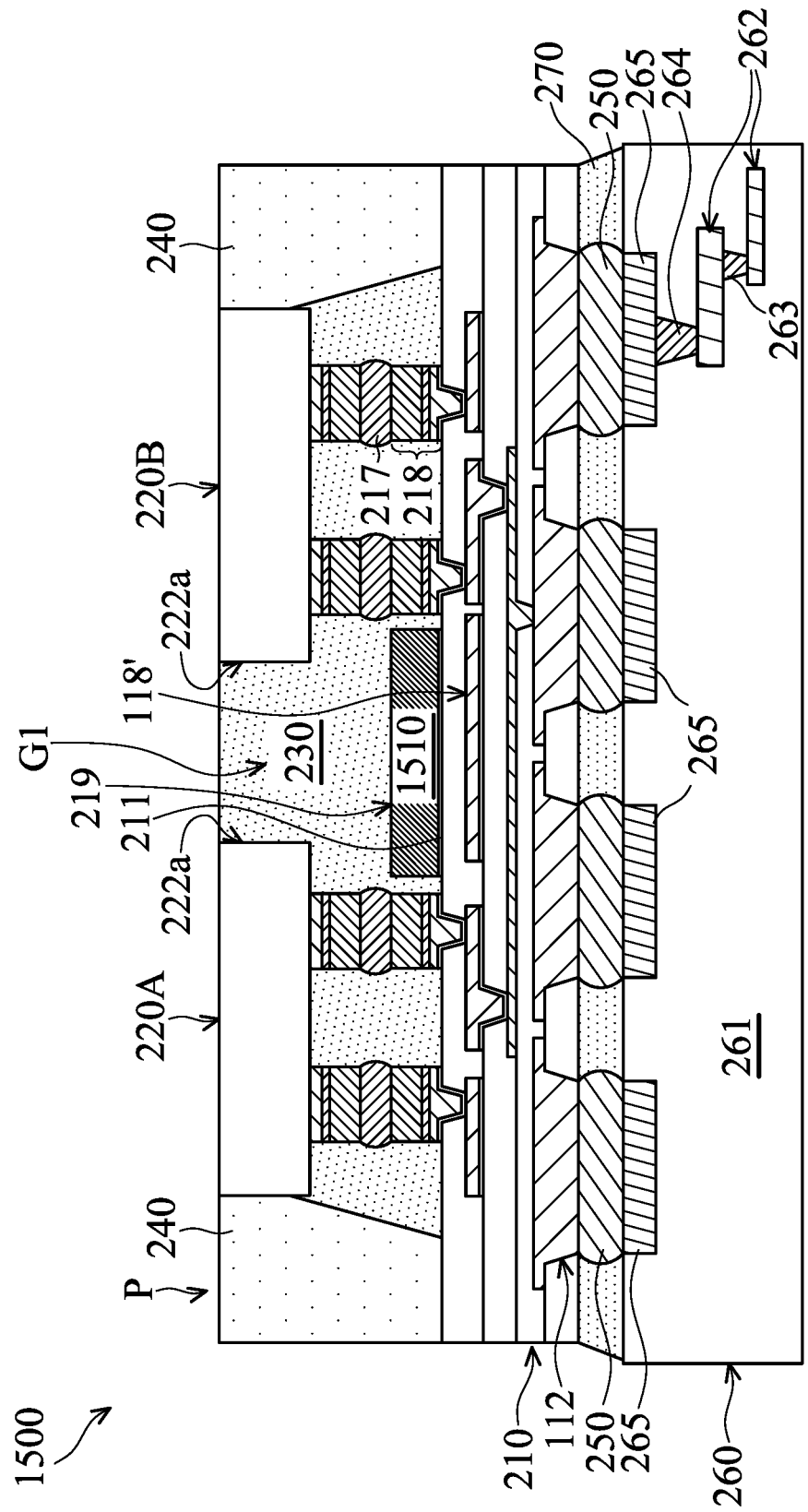

FIGS. 15A-15C are cross-sectional views of various stages of a process for forming a chip package structure, in accordance with some embodiments. As shown in FIG. 15A, the step of FIG. 1C is performed to form the dielectric layer 119 and the seed layer 211 over the dielectric layer 117 and the wiring layer 118d, in accordance with some embodiments. As shown in FIG. 15A, a mask layer 212C is formed over the seed layer 211, in accordance with some embodiments. The mask layer 212C has an opening 212b exposing the seed layer 211 thereunder, in accordance with some embodiments.

As shown in FIG. 15A, a conductive layer 1510 is formed in the opening 212b and over the seed layer 211, in accordance with some embodiments. The conductive layer 1510 is made of a conductive material, such as metal (e.g., titanium, copper, and/or nickel) or alloys thereof (e.g. titanium copper), in accordance with some embodiments. The conductive layer 1510 is formed using a plating process, such as an electroplating process, in accordance with some embodiments.

As shown in FIG. 15B, the mask layer 212C is removed, in accordance with some embodiments. As shown in FIG. 15B, a mask layer 1520 is formed over the seed layer 211, in accordance with some embodiments. The mask layer 1520 has openings 1522 exposing the seed layer 211 thereunder, in accordance with some embodiments. The mask layer 1520 is made of a polymer material, such as a photoresist material, in accordance with some embodiments.

As shown in FIG. 15B, the step of FIGS. 1C and 1D are performed to form the under bump metallization layer 213, the barrier layer 214, the conductive layer 215, and the solder layer 217a in the openings 1522, in accordance with some embodiments.

As shown in FIG. 15C, the mask layer 1520 is removed, in accordance with some embodiments. As shown in FIG. 15C, the steps of FIGS. 1E-1I are performed to form a chip package structure 1500, in accordance with some embodiments. The shield bump structure 219 includes the conductive layer 1510 and the seed layer 211 thereunder, in accordance with some embodiments.

Figure 16A:
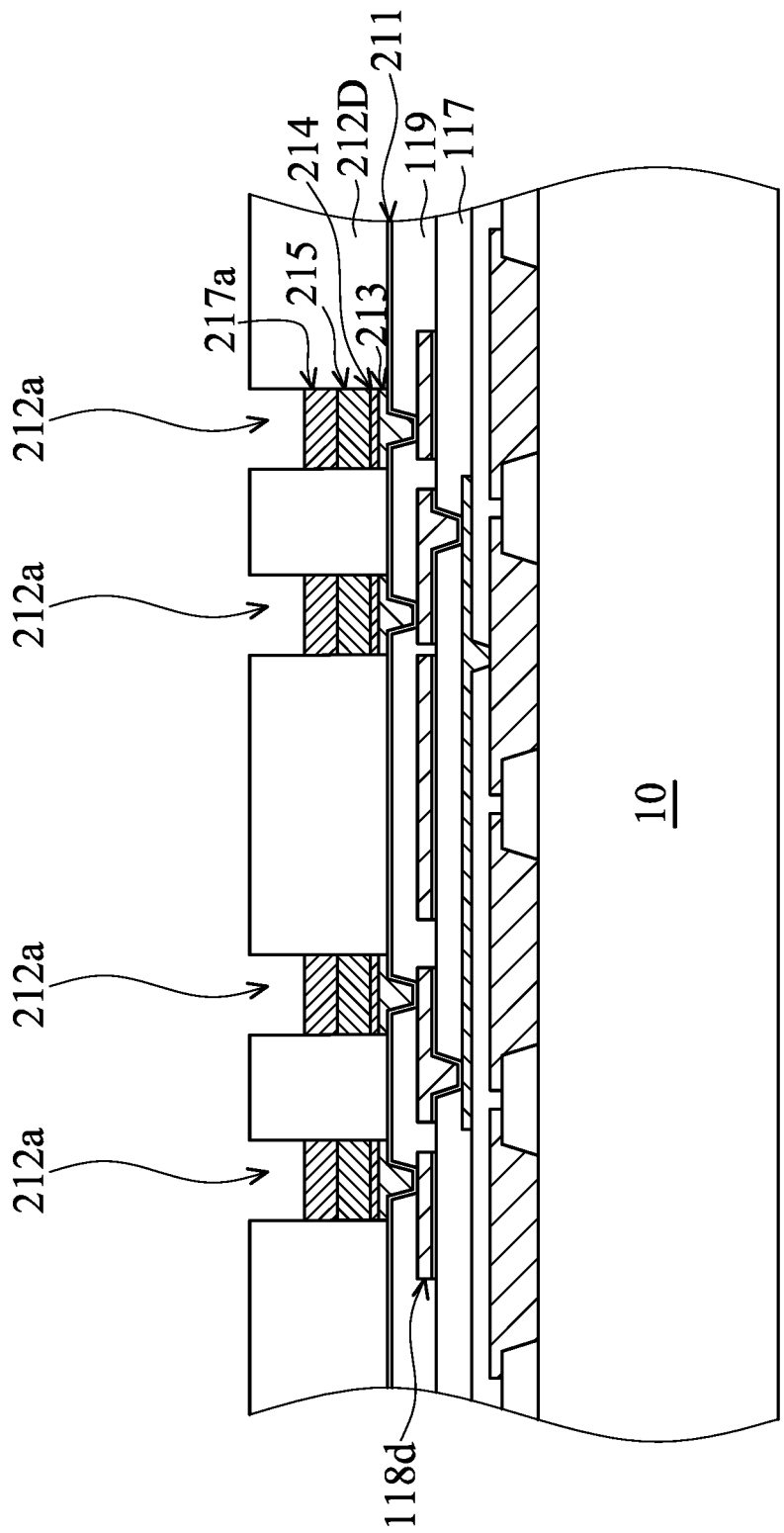
Figure 16B:
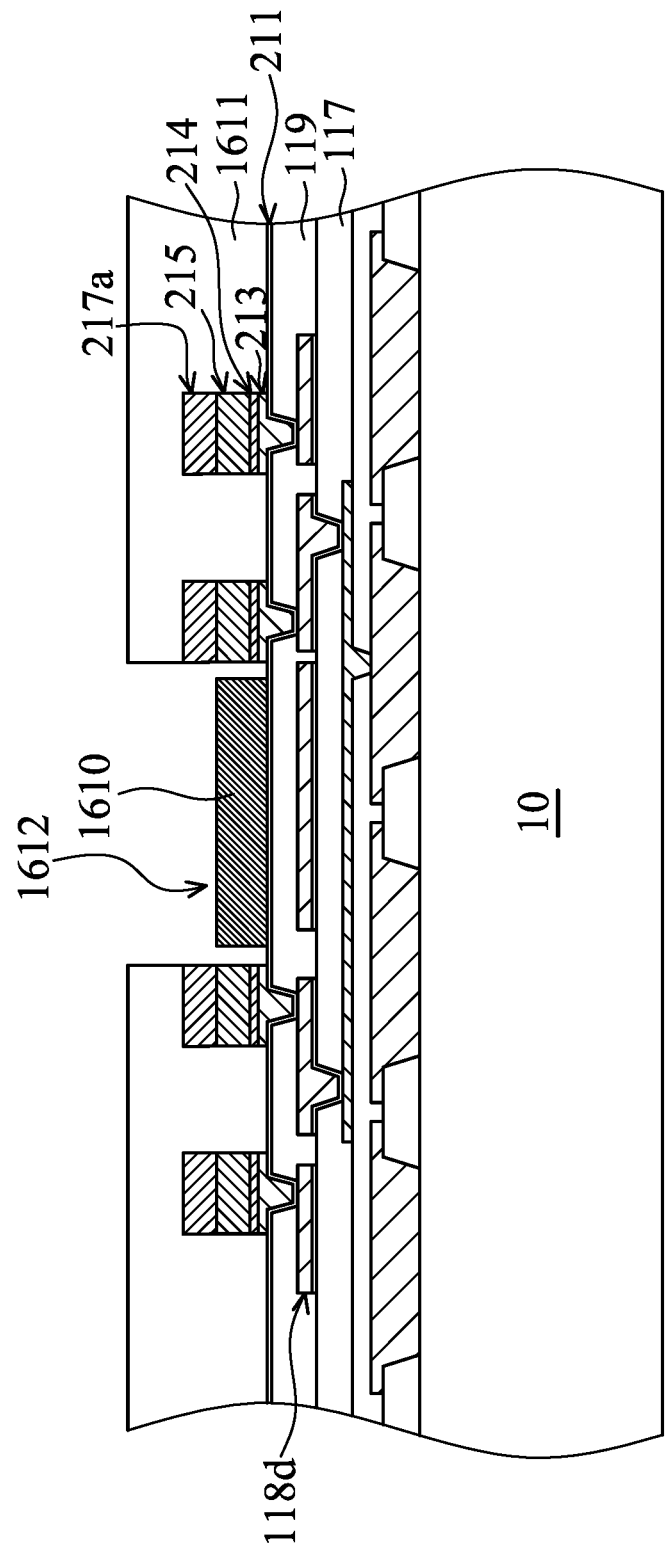
Figure 16C:
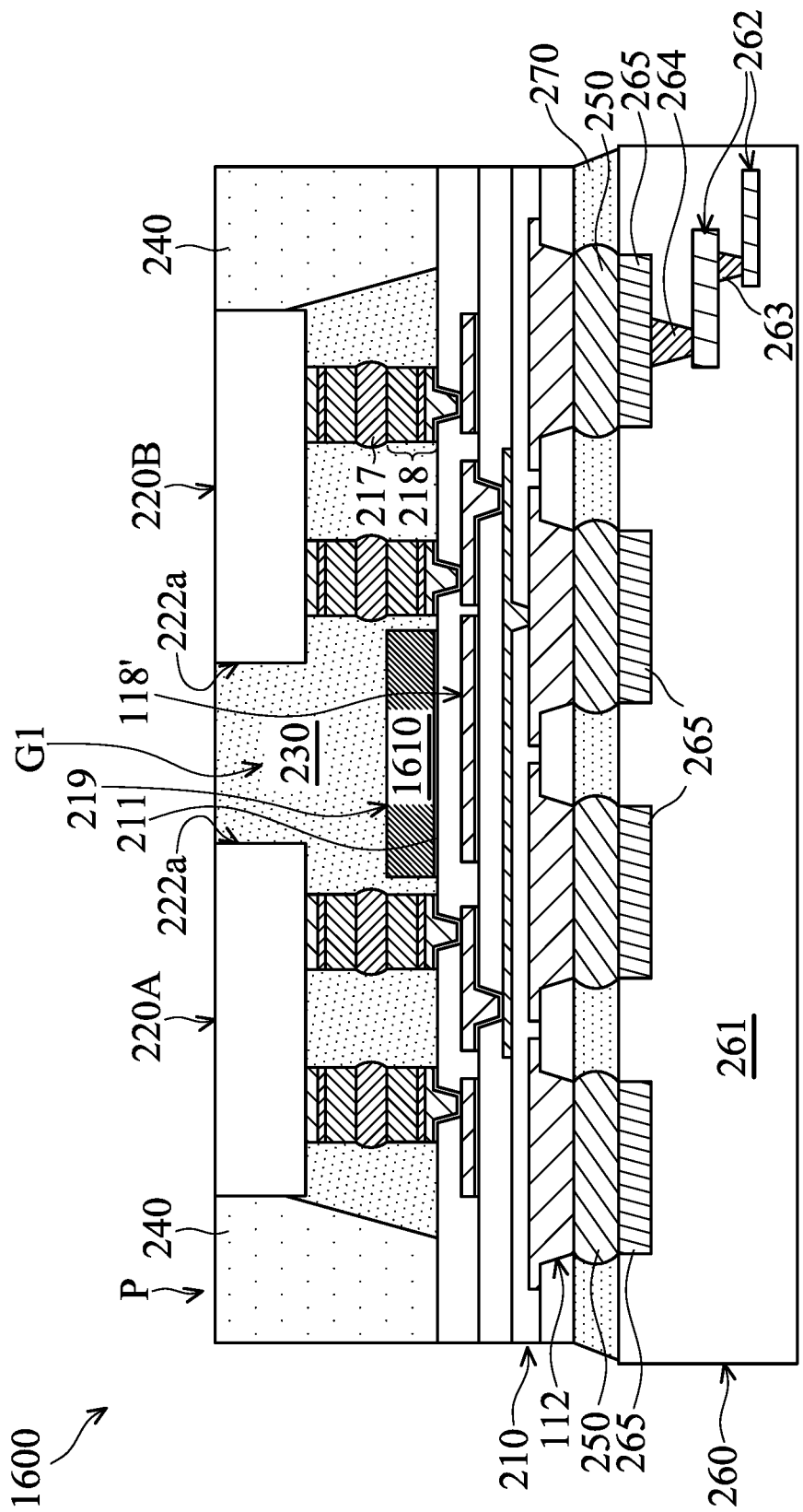

FIGS. 16A-16C are cross-sectional views of various stages of a process for forming a chip package structure, in accordance with some embodiments. As shown in FIG. 16A, the step of FIG. 1C is performed to form the dielectric layer 119 and the seed layer 211 over the dielectric layer 117 and the wiring layer 118d, in accordance with some embodiments.

As shown in FIG. 16A, a mask layer 212D is formed over the seed layer 211, in accordance with some embodiments. The mask layer 212D has openings 212a exposing the seed layer 211 thereunder, in accordance with some embodiments. The mask layer 212D is made of a polymer material, such as a photoresist material, in accordance with some embodiments.

As shown in FIG. 16A, the step of FIGS. 1C and 1D are performed to form the under bump metallization layer 213, the barrier layer 214, the conductive layer 215, and the solder layer 217a in the openings 212a, in accordance with some embodiments. As shown in FIG. 16B, the mask layer 212D is removed, in accordance with some embodiments.

As shown in FIG. 16B, a mask layer 1611 is formed over the seed layer 211, the under bump metallization layer 213, the barrier layer 214, the conductive layer 215, and the solder layer 217a, in accordance with some embodiments. The mask layer 1611 has an opening 1612 exposing the seed layer 211 thereunder, in accordance with some embodiments.

As shown in FIG. 16B, a conductive layer 1610 is formed in the opening 1612 and over the seed layer 211, in accordance with some embodiments. The conductive layer 1610 is made of a conductive material, such as metal (e.g., titanium, copper, nickel, aluminum, or tungsten) or alloys thereof, in accordance with some embodiments. The conductive layer 1610 is formed using a plating process, such as an electroplating process, in accordance with some embodiments.

As shown in FIG. 16C, the mask layer 1611 is removed, in accordance with some embodiments. As shown in FIG. 16C, the steps of FIGS. 1E-1I are performed to form a chip package structure 1600, in accordance with some embodiments. The shield bump structure 219 includes the conductive layer 1610 and the seed layer 211 thereunder, in accordance with some embodiments.

Processes and materials for forming the chip package structures 200, 300, 400, 500, 600, 700, 800, 900, 1000, 1100, 1200, 1300, 1400, 1500 and 1600 may be similar to, or the same as, those for forming the chip package structure 100 described above.

In accordance with some embodiments, chip package structures and methods for forming the same are provided. The methods (for forming the chip package structure) form a shield bump structure under a gap between two chip structures and over a redistribution structure to prevent the stress concentrated in the gap from damaging wires under the gap.

In accordance with some embodiments, a chip package structure is provided. The chip package structure includes a redistribution structure including a dielectric structure and a plurality of wiring layers in or over the dielectric structure. The chip package structure includes a shield bump structure over the redistribution structure and electrically insulated from the wiring layers. The chip package structure includes a first chip structure bonded to the redistribution structure. The first chip structure is electrically insulated from the shield bump structure, and the first chip structure partially overlaps the shield bump structure. The chip package structure includes a second chip structure bonded to the redistribution structure. The second chip structure is electrically insulated from the shield bump structure, the second chip structure partially overlaps the shield bump structure, the first chip structure and the second chip structure are spaced apart from each other by a gap, and the shield bump structure extends across the gap.

In accordance with some embodiments, a chip package structure is provided. The chip package structure includes a redistribution structure including a dielectric structure and a plurality of wiring layers in or over the dielectric structure. The chip package structure includes a shield bump structure over the redistribution structure and electrically insulated from the wiring layers. The chip package structure includes a first chip structure bonded to the redistribution structure. The first chip structure is electrically insulated from the shield bump structure, the first chip structure extends across a first sidewall of the shield bump structure, a wire of one of the wiring layers extends across a second sidewall of the first chip structure, and the shield bump structure covers a portion of the wire under the second sidewall.

In accordance with some embodiments, a chip package structure is provided. The chip package structure includes a redistribution structure including a dielectric structure and a plurality of wiring layers in or over the dielectric structure. The chip package structure includes a shield bump structure over the redistribution structure and electrically insulated from the wiring layers. The shield bump structure is a continuous structure. The chip package structure includes a first chip structure bonded to the redistribution structure. The first chip structure is electrically insulated from the shield bump structure. The chip package structure includes a second chip structure bonded to the redistribution structure. The second chip structure is electrically insulated from the shield bump structure. The shield bump structure includes a first portion and a second portion, and the first chip structure and the second chip structure respectively overlap the first portion and the second portion in a direction perpendicular to a top surface of the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
    a redistribution structure comprising a dielectric structure and a plurality of wiring layers in or over the dielectric structure;
    a shield bump structure over the redistribution structure and electrically insulated from the wiring layers;
    a first chip structure bonded to the redistribution structure, wherein the first chip structure is electrically insulated from the shield bump structure, and the first chip structure partially overlaps the shield bump structure; and
    a second chip structure bonded to the redistribution structure, wherein the second chip structure is electrically insulated from the shield bump structure, the second chip structure partially overlaps the shield bump structure, the first chip structure and the second chip structure are spaced apart from each other by a gap, and the shield bump structure extends across the gap, wherein the redistribution structure further comprises a shield pad over the dielectric structure, the shield pad is electrically insulated from the wiring layers, the first chip structure, the second chip structure, and the shield bump structure, and the first chip structure and the shield bump structure both partially overlap the shield pad.

2. The chip package structure as claimed in claim 1, wherein a first portion of the shield bump structure is between the first chip structure and the shield pad.

3. The chip package structure as claimed in claim 2, wherein the second chip structure partially overlaps the shield pad.

4. The chip package structure as claimed in claim 3, wherein a second portion of the shield bump structure is between the second chip structure and the shield pad.

5. The chip package structure as claimed in claim 1, wherein the shield bump structure is thicker than the shield pad.

6. The chip package structure as claimed in claim 1, wherein the shield pad has a mesh shape.

7. The chip package structure as claimed in claim 1, wherein the shield bump structure is thicker than the wiring layers.

8. The chip package structure as claimed in claim 1, wherein the shield bump structure has a mesh shape.

9. A chip package structure, comprising:
    a redistribution structure comprising a dielectric structure and a plurality of wiring layers in or over the dielectric structure;
    a shield bump structure over the redistribution structure and electrically insulated from the wiring layers;
    a first chip structure bonded to the redistribution structure, wherein the first chip structure is electrically insulated from the shield bump structure, the first chip structure extends across a first sidewall of the shield bump structure, a wire of one of the wiring layers extends across a second sidewall of the first chip structure, and the shield bump structure covers a portion of the wire under the second sidewall; and
    a second chip structure bonded to the redistribution structure, wherein the second chip structure is electrically insulated from the shield bump structure, the second chip structure extends across a third sidewall of the shield bump structure, the first chip structure and the second chip structure are spaced apart from each other, the second chip structure has a fourth sidewall facing the second sidewall of the first chip structure, the shield bump structure extends across the fourth sidewall and the second sidewall, the shield bump structure has a serpentine line, and a main portion of the serpentine line laterally extends across the fourth sidewall and the second sidewall.

10. The chip package structure as claimed in claim 9, wherein the wire further extends across the third sidewall of the shield bump structure.

11. The chip package structure as claimed in claim 10, wherein the wire is thinner than the shield bump structure.

12. A chip package structure, comprising:
    a redistribution structure comprising a dielectric structure and a plurality of wiring layers in or over the dielectric structure;
    a shield bump structure over the redistribution structure and electrically insulated from the wiring layers, wherein the shield bump structure is a continuous structure;
    a first chip structure bonded to the redistribution structure, wherein the first chip structure is electrically insulated from the shield bump structure; and
    a second chip structure bonded to the redistribution structure, wherein the second chip structure is electrically insulated from the shield bump structure,
    the shield bump structure comprises a first portion and a second portion, the first chip structure and the second chip structure respectively overlap the first portion and the second portion in a direction perpendicular to a top surface of the redistribution structure,
    the redistribution structure further comprises a shield pad over the dielectric structure, the shield pad is electrically insulated from the wiring layers, the first chip structure, the second chip structure, and the shield bump structure, and the shield bump structure overlaps the shield pad.

13. The chip package structure as claimed in claim 12, wherein the first portion of the shield bump structure is between the first chip structure and the shield pad.

14. The chip package structure as claimed in claim 13, wherein the second portion of the shield bump structure is between the second chip structure and the shield pad.

15. The chip package structure as claimed in claim 12, wherein the shield bump structure has a first mesh shape, and the shield pad has a second mesh shape.

16. The chip package structure as claimed in claim 12, wherein the shield bump structure is thicker than the shield pad.

17. The chip package structure as claimed in claim 12, wherein a first top surface of the shield pad is substantially level with a second top surface of one of the wiring layers.

18. The chip package structure as claimed in claim 12, wherein the shield pad has openings.

19. The chip package structure as claimed in claim 12, wherein the shield pad and the shield bump structure have a same shape in a top view of the shield pad and the shield bump structure.

20. The chip package structure as claimed in claim 19, wherein a peripheral portion of the shield pad is not covered by the shield bump structure.

\* \* \* \* \*